United States Patent
Toyoda

(10) Patent No.: US 11,145,552 B2
(45) Date of Patent: Oct. 12, 2021

(54) METHOD OF MANUFACTURING SEMICONDUCTOR INTEGRATED CIRCUIT

(71) Applicant: FUJI ELECTRIC CO., LTD., Kawasaki (JP)

(72) Inventor: Yoshiaki Toyoda, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/726,287

(22) Filed: Dec. 24, 2019

(65) Prior Publication Data

US 2020/0266109 A1  Aug. 20, 2020

(30) Foreign Application Priority Data

Feb. 15, 2019  (JP) ................. JP2019-25863

(51) Int. Cl.
| | |
|---|---|
| H01L 21/265 | (2006.01) |
| H01L 21/02 | (2006.01) |
| H01L 21/8234 | (2006.01) |
| H01L 21/3115 | (2006.01) |

(52) U.S. Cl.
CPC ......... *H01L 21/823493* (2013.01); *H01L 21/31155* (2013.01); *H01L 21/823487* (2013.01)

(58) Field of Classification Search
CPC .............................................. H01L 21/823487
USPC .......... 257/609–613; 438/517–521, 526–529
See application file for complete search history.

(56) References Cited

U.S. PATENT DOCUMENTS

| | | | |
|---|---|---|---|
| 4,819,052 A * | 4/1989 | Hutter .................. | H01L 21/743 257/378 |
| 6,323,518 B1 | 11/2001 | Sakamoto et al. | |
| 6,914,298 B1 * | 7/2005 | Hamazawa ......... | H01L 29/0878 257/343 |
| 8,105,924 B2 * | 1/2012 | Orner .................. | H01L 29/0821 438/510 |
| 2001/0033666 A1 | 10/2001 | Benz | |
| 2001/0048132 A1 | 12/2001 | Ito et al. | |
| 2004/0032005 A1 | 2/2004 | Williams et al. | |

(Continued)

FOREIGN PATENT DOCUMENTS

| | | |
|---|---|---|
| JP | 2000-91344 A | 3/2000 |
| JP | 2001-339063 A | 12/2001 |

(Continued)

*Primary Examiner* — Calvin Lee

(57) ABSTRACT

A semiconductor integrated circuit includes: implanting impurity ions of a p-type at different implantation positions by multiple implantation in a part of an upper portion of a semiconductor layer of an $n^-$-type to form first ion implantation regions; implanting the impurity ions of the p-type at different implantation positions by multiple implantation in another part of the upper portion of the semiconductor layer to form second ion implantation regions; activating the impurity ions in the first ion implantation regions to form a well region, and activating the impurity ions in the second ion implantation regions to form a body region; forming a control element including first and second terminal regions of the $n^+$-type in an upper portion of the well region; and forming an output-stage element including an output terminal region of the $n^+$-type in an upper portion of the body region to be controlled by the control element.

19 Claims, 22 Drawing Sheets

(56) References Cited

U.S. PATENT DOCUMENTS

| | | |
|---|---|---|
| 2006/0054970 A1 | 3/2006 | Yanagida et al. |
| 2014/0008718 A1 | 1/2014 | Toyoda |
| 2016/0254198 A1 | 9/2016 | Toyoda et al. |

FOREIGN PATENT DOCUMENTS

| | | |
|---|---|---|
| JP | 2006-80177 A | 3/2006 |
| JP | 2012-80117 A | 4/2012 |
| JP | 5641131 B2 | 12/2014 |
| JP | 6037085 B2 | 11/2016 |

\* cited by examiner

METHOD OF MANUFACTURING SEMICONDUCTOR INTEGRATED CIRCUIT

CROSS-REFERENCE TO RELATED APPLICATION

This application claims benefit of priority under 35 USC 119 based on Japanese Patent Application No. 2019-025863 filed on Feb. 15, 2019, the entire contents of which are incorporated by reference herein.

BACKGROUND OF THE INVENTION

1. Field of the Invention

The present invention relates to a method of manufacturing a semiconductor integrated circuit. In particular, the present invention relates to a method of manufacturing a power semiconductor integrated circuit (power IC) in which a vertical power semiconductor element in an output stage and a horizontal semiconductor element (control element) for controlling the power semiconductor element are monolithically integrated into a single semiconductor chip.

2. Description of the Related Art

JP 2000-91344 A, JP 5641131 B2, and JP 6037085 B2 disclose a power IC in which a vertical MOSFET in an output stage and a horizontal MOSFET for controlling the vertical MOSFET are monolithically integrated (mixed) into a single semiconductor chip. A method of manufacturing the power IC disclosed in these documents implants impurity ions into a surface of a semiconductor substrate so as to form a body region for forming a vertical output-stage element by annealing at a high temperature while taking a long time. The method further implants impurity ions into a predetermined portion on the surface of the semiconductor substrate so as to form a well region for forming a horizontal control element by annealing at a high temperature for a long time. Since the method carries out the annealing several times at a high temperature for a long period of time, the time required for manufacturing the power IC is inevitably increased. The annealing conducted several times causes a variation in impurity concentration in diffusion layers to lead to unevenness of device characteristics.

JP2006-80177 A, JP 2001-339063 A, and JP 2012-80117 A disclose a technique for forming diffusion layers with regard to a vertical output-stage element and a horizontal control element without conducting annealing at a high temperature for a long period of time. JP2006-80177 A and JP 2001-339063 A disclose a technique for forming a body region of a trench MOSFET using an ion implantation apparatus at a high acceleration voltage. JP 2012-80117 A discloses a technique for forming an isolation diffusion layer with a minimum of annealing so as to avoid excessive diffusion of impurity ions.

However, the above documents all fail to deal with an improvement in integration density or a reduction in manufacture time of the semiconductor integrated circuit in which the vertical output-stage element and the horizontal control element are integrated in a semiconductor chip.

SUMMARY OF THE INVENTION

In response to the above issue, the present invention provides a method of manufacturing a semiconductor integrated circuit capable of improving electrical characteristics and providing a high-density integration structure with high efficiency of area usage for a short period of time.

An aspect of the present invention inheres in a method of manufacturing a semiconductor integrated circuit, encompassing: implanting impurity ions of a second conductivity-type at different implantation positions by multiple implantation in a part of an upper portion of a semiconductor layer of a first conductivity-type so as to selectively form first ion implantation regions; implanting the impurity ions of the second conductivity-type at different implantation positions by multiple implantation in another part of the upper portion of the semiconductor layer so as to selectively form second ion implantation regions; activating the impurity ions in the first ion implantation regions to form a well region of the second conductivity-type, and activating the impurity ions in the second ion implantation regions to form a body region of the second conductivity-type; forming a control element including first and second terminal regions of the first conductivity-type opposed to each other in an upper portion of the well region; and forming an output-stage element including an output terminal region of the first conductivity-type in an upper portion of the body region so as to be controlled by the control element.

Figure 1:
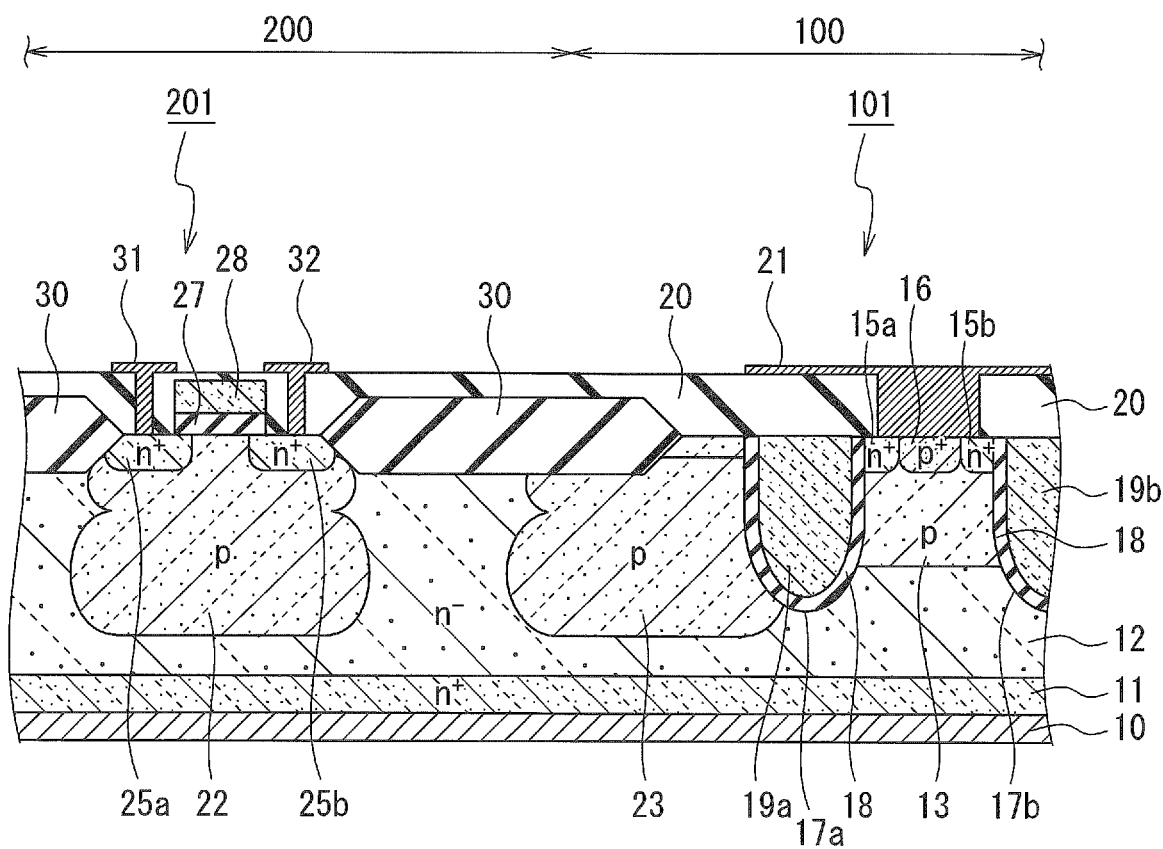
FIG. 1 is a cross-sectional view of main components illustrating an example of a semiconductor integrated circuit according to an embodiment of the present invention.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In a semiconductor integrated circuit according to the embodiment of the present invention, various semiconductor elements are monolithically integrated in a single semiconductor chip. In the embodiment of the present invention, a "first terminal region" and a "second terminal region" of a control element (semiconductor element) integrated in a circuit unit is assigned to a semiconductor region which is a source region or a drain region in a field-effect transistor (FET) or a static induction transistor (SIT), in which a main current flows in or out. In some appropriate cases, a function of the first terminal region and a function of the second terminal region are exchangeable each other by exchanging a bias relationship if the structure of the subject semiconductor device is symmetric such as metal-insulator-semiconductor (MIS) FET.

In the present specification, a "first main electrode region" and a "second main electrode region" are defined in an output stage element. The first main electrode region and the second main electrode region has a relationship the same as the first terminal region and the second terminal region. The first main electrode region and the second main electrode region are a main electrode region of the output stage element (semiconductor element), in which a main current flows in or out. The first main electrode region of the semiconductor element integrated as the output stage element is assigned to a semiconductor region which is an emitter region or a collector region in an insulated-gate bipolar transistor (IGBT). The first main electrode region of the integrated output stage element is assigned to a semiconductor region which is an anode region or a cathode region in a static induction (SI) thyristor or a gate turn-off (GTO) thyristor. The second main electrode region of the integrated output stage element is assigned to a semiconductor region which is not assigned as the first main electrode region and will be the source region or the drain region in the FET or the SIT, the emitter region or the collector region in the IGBT, and the anode region or the cathode region in the SI thyristor or the GTO thyristor.

That is, when the first main electrode region of the output stage element integrated in a semiconductor chip is the source region, the second main electrode region means the drain region. When the first main electrode region is the emitter region, the second main electrode region means the collector region. When the first main electrode region is the anode region, the second main electrode region means the cathode region. A "main electrode region" is described in the Specification, the main electrode region comprehensively means any one of the first main electrode region and the second main electrode region.

Further, definitions of directions such as an up-and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

<Semiconductor Integrated Circuit>

A semiconductor integrated circuit according to the embodiment of the present invention is illustrated below with a high-side power IC. The semiconductor integrated circuit according to the embodiment of the present invention is a power IC in which an output unit 100 arranged on the right side and a circuit unit 200 arranged on the left side are monolithically integrated in a single chip, as illustrated in FIG. 1.

The output unit 100 includes an output-stage element 101 serving as a vertical power semiconductor element. The semiconductor integrated circuit according to the embodiment of the present invention is illustrated with a case in which the output-stage element 101 is a vertical trench gate n-MOSFET for illustration purposes. A main current flows in the output-stage element 101 between first main electrode regions (source regions) 15a and 15b on the top surface (front surface) side and a second main electrode region (drain region) on the bottom surface (rear surface) side through a semiconductor region in which channels are formed. A rear surface contact layer 11 serves as a drain region (second main electrode region), and a semiconductor layer 12 serves as a drift layer. A rear surface electrode 10 serving as a drain electrode is deposited on the rear surface side of the rear surface contact layer 11, and is connected to a power supply voltage terminal.

While the semiconductor integrated circuit according to the embodiment of the present invention is illustrated below with a case in which a semiconductor base body (11, 12) implementing a semiconductor chip is made of a semiconductor material of silicon (Si) as a base material, the base material is not limited to Si. FIG. 1 illustrates the semiconductor base body (11, 12) having a structure in which the semiconductor layer 12 of a first conductivity-type (n$^-$-type) having a lower impurity concentration than the rear surface contact layer 11 is epitaxially grown on the rear surface contact layer 11 made of a semiconductor substrate (Si wafer) of the first conductivity-type (n$^+$-type) having a higher impurity concentration. The semiconductor base body (11, 12) may be implemented such that the rear surface contact layer 11 serving as a diffusion layer of n$^+$-type may be formed on the rear surface of a semiconductor substrate (Si wafer) of n$^-$-type to be used as the semiconductor layer 12 by ion implantation or thermal diffusion.

When the rear surface contact layer 11 is made of a semiconductor substrate, the rear surface contact layer 11 having an impurity concentration in a range of about $2\times10^{18}$ cm$^{-3}$ to $1\times10^{19}$ cm$^{-3}$, for example, is easily available in the market. The impurity concentration of the semiconductor layer 12 then can be determined in a range of about $1\times10^{12}$ cm$^{-3}$ to $1\times10^{16}$ cm$^{-3}$, and is set in a range of about $1\times10^{15}$ cm$^{-3}$ to $1\times10^{16}$ cm$^{-3}$ in this embodiment, for example. When the rear surface contact layer 11 serving as a diffusion layer of n$^+$-type is provided on the rear surface of the semiconductor layer 12 made of a semiconductor substrate of n$^-$-type, the impurity concentration of the rear surface contact layer 11 can be set in a range of about $5\times10^{18}$ cm$^{-3}$ to $1\times10^{21}$ cm$^{-3}$. The rear surface contact layer 11 does not necessarily have a uniform impurity concentration, and may have a profile having a high impurity concentration increased to about $1\times10^{21}$ cm$^{-3}$ at an interface between the rear surface contact layer 11 and a rear surface electrode (not illustrated) connected to the rear surface contact layer 11. For example, the rear surface contact layer 11 may have a composite structure including a layer having an impurity concentration in a range of about $5 \times 10^{18}$ cm$^{-3}$ to $2 \times 10^{19}$ cm$^{-3}$ on the semiconductor layer 12 side, and a layer having an impurity concentration in a range of about $3 \times 10^{19}$ cm$^{-3}$ to $1 \times 10^{21}$ cm$^{-3}$ on the rear surface electrode side.

The output unit 100 is provided with a body region (base region) 13 of a second conductivity-type (p-type) in an upper portion of the semiconductor layer 12. The body region 13 in the semiconductor integrated circuit according to the embodiment of the present invention is formed by multiple ion implantation at different acceleration voltages and by annealing for a short period of time. Regulating the number of multiple ion implantation steps and the acceleration voltages as appropriate can achieve a doping profile depending on the required characteristics, such as a stepped doping profile in the depth direction of the body region 13, a profile having an impurity concentration higher in a deeper portion than in a shallower portion (a retrograde well), and a profile approximate to a Gaussian distribution form.

The paired first main electrode regions 15a and 15b of n$^+$-type having a higher impurity concentration than the semiconductor layer 12 are selectively provided in an upper portion of the body region 13. A base contact region 16 of p$^+$-type is selectively provided in the upper portion of the body region 13 between the paired first main electrode regions 15a and 15b so as to be in contact with the respective first main electrode regions 15a and 15b. An output terminal wiring (source electrode wiring) 21 is deposited on the base contact region 16 and the first main electrode regions 15a and 15b, and is connected to the output terminal. The first main electrode regions 15a and 15b are defined as an "output terminal region" in the semiconductor integrated circuit according to the embodiment of the present invention.

A pair of trenches 17a and 17b is dug into the top surface of the semiconductor layer 12, and the side surfaces of the trenches 17a and 17b are at least partly in contact with the body region 13. Gate electrodes 19a and 19b are buried in the paired trenches 17a and 17b via a gate insulating film 18 provided along the inner surfaces of the trenches 17a and 17b so as to implement a trench gate control electrode structure (18, 19a, and 19b).

A silicon oxide (SiO$_2$) film may be used as the gate insulating film 18, and other examples include a silicon oxynitride (SiON) film, a strontium oxide (SrO) film, a silicon nitride (Si$_3$N$_4$) film, and an aluminum oxide (Al$_2$O$_3$) film. Still other examples include a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, and a bismuth oxide (Bi$_2$O$_3$) film. A composite film including two or more of the above films stacked on one another may also be used as the gate insulating film 18.

The gate electrodes 19a and 19b statically control the surface potential of the semiconductor region on the side surface side of the trenches 17a and 17b in the body region 13 via the gate insulating film 18, so as to form inversion channels on the side surface side of the trenches 17a and 17b. A material used for the gate electrodes 19a and 19b may be polysilicon (doped polysilicon: DOPOS) to which n-type impurity ions are doped at a high concentration. Instead of DOPOS, refractory metal such as tungsten (W), molybdenum (Mo), and titanium (Ti), or a silicide of refractory metal and polysilicon may be used as the material for the gate electrodes 19a and 19b. The gate electrodes 19a and 19b may also be a polycide film which is a composite film of polysilicon and a silicide of refractory metal.

An interlayer insulating film 20 is deposited on the gate electrodes 19a and 19b. The interlayer insulating film 20 may be a borophosphosilicate glass film (BPSG film). The trenches 17a and 17b may be a single trench having a circular shape in a planar pattern.

The circuit unit 200 includes a control element 201 for controlling the output-stage element 101. The control element 201 is a horizontal n-MOSFET, and may implement a complementary MOS (CMOS) with a p-MOSFET (not illustrated). The control element 201 is provided in a region (first well region) 22 of the second conductivity-type (p-type) in the upper portion of the semiconductor layer 12.

A well region (second well region) 23 of the second conductivity-type (p-type) is provided in the upper portion of the semiconductor layer 12 separately from the first well region 22. The second well region 23 is provided in the end region of the output-stage element 101 so as to reduce an electric field. The first well region 22 and the second well region 23 have a depth deeper than the body region 13 and deeper than the trenches 17a and 17b, for example. The first well region 22 and the second well region 23 have substantially the same impurity concentration, and have substantially the same depth. The first well region 22 and the second well region 23 may have different impurity concentrations and different depths. The first well region 22 and the second well region 23 can be formed in the same manufacturing step so as to decrease the number of steps.

The first well region 22 and the second well region 23 are formed by multiple ion implantation at different acceleration voltages and by annealing for a short period of time, as in the case of the body region 13 in the output unit 100. Regulating the number of ion implantation steps and the acceleration voltages as appropriate can achieve a doping profile depending on the required characteristics, such as a stepped doping profile in the depth direction of the first well region 22 and the second well region 23, a profile having an impurity concentration higher in a deeper portion than in a shallower portion (a retrograde well), and a profile approximate to a Gaussian distribution form. The cross section of the first well region 22 and the second well region 23 is not limited to the configuration illustrated in FIG. 1, and may vary depending on the number of ion implantation steps and the acceleration voltages.

As illustrated in FIG. 1, the control element 201 in the circuit unit 200 has a configuration in which a first terminal region (source region) 25a and a second terminal region (drain region) 25b of the first conductivity-type (n$^+$-type) are provided to be opposed to each other in the upper portion of the first well region 22. The first terminal region 25a and the second terminal region 25b are semiconductor regions of n$^+$-type having a higher impurity concentration than the semiconductor layer 12 and selectively provided in the upper portion of the first well region 22 separately from each other. In the semiconductor integrated circuit according to the embodiment of the present invention, the first terminal region 25a and the second terminal region 25b have substantially the same impurity concentration and substantially the same depth as the first main electrode regions 15a and 15b in the output unit 100. The first terminal region 25a and the second terminal region 25b do not necessarily have the same impurity concentration or the same depth as the first main electrode regions 15a and 15b. The respective first and second terminal regions 25a and 25b and the first main electrode regions 15a and 15b can be formed in the same manufacturing step so as to decrease the number of steps.

A planar control electrode structure (27, 28) extends in the lateral direction on the first well region 22. The control electrode structure (27, 28) includes a gate insulating film 27 provided on the first well region 22 between the first terminal region 25a and the second terminal region 25b, and a control electrode (gate electrode) 28 deposited on the gate insulating film 27.

The gate insulating film 27 may be made of the same material as the gate insulating film 18, which may be a $SiO_2$ film, for example. The gate electrode 28 statically controls the surface potential of the first well region 22 via the gate insulating film 27, so as to form inversion channels in the surface layer of the first well region 22. The gate electrode 28 may be made of the same material as the gate electrodes 19a and 19b, which may be DOPOS, for example.

A first circuit terminal wiring (source electrode wiring) 31 made of a metal material such as Al is deposited on the first terminal region 25a. A second circuit terminal wiring (drain electrode wiring) 32 made of a metal material such as Al is deposited on the second terminal region 25b. A field oxide film 30 is selectively provided on the top surface of the semiconductor layer 12 between the control element 201 and the output-stage element 101, for example.

Figure 2:
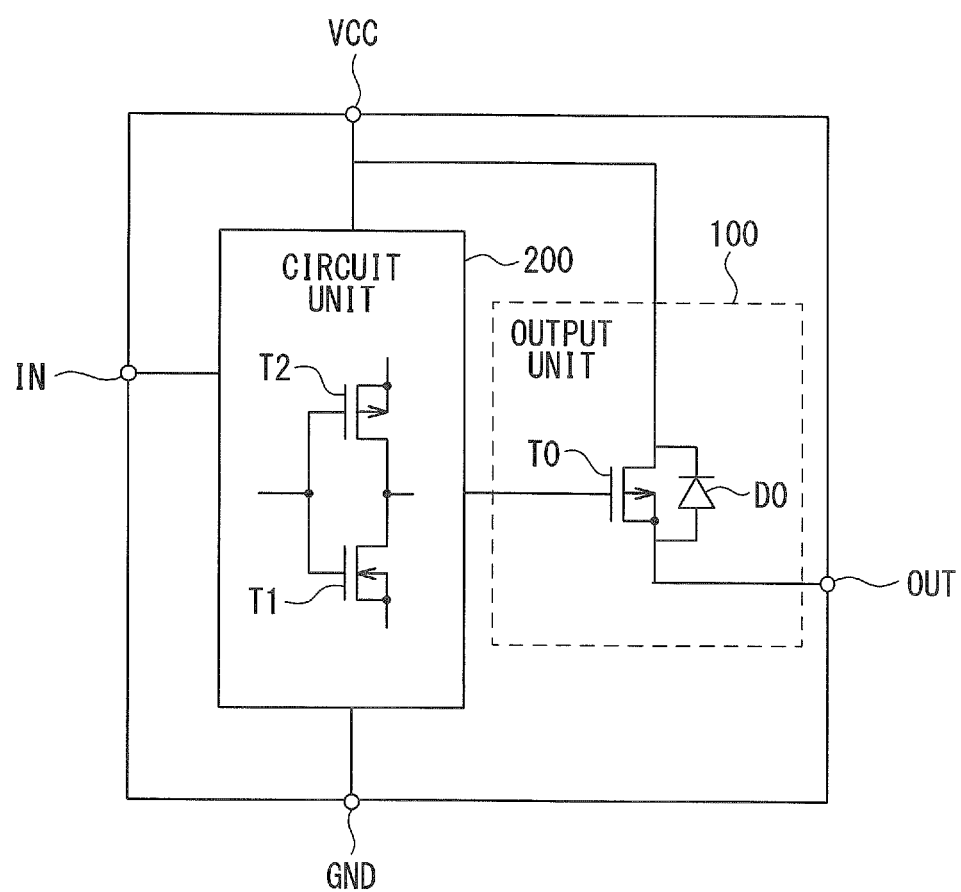
FIG. 2 is an equivalent circuit diagram illustrating the example of the semiconductor integrated circuit according to the embodiment of the present invention.

FIG. 2 is an equivalent circuit diagram of the semiconductor integrated circuit according to the embodiment of the present invention. It is also apparent from FIG. 2 that the semiconductor integrated circuit according to the embodiment of the present invention includes the output unit 100 and the circuit unit 200. The control element 201 illustrated in FIG. 1 corresponds to a MOS transistor T1 included in the circuit unit 200 illustrated in FIG. 2. The MOS transistors T1 and T2 implement a CMOS circuit, and correspond to apart of a control circuit for controlling the output unit 100, for example. The output-stage element 101 illustrated in FIG. 1 corresponds to a MOS transistor T0 included in the output unit 100 illustrated in FIG. 2. The MOS transistor T0 is connected with a freewheeling diode D0. A source terminal of the MOS transistor T0 is connected to an output terminal OUT, and a drain terminal of the MOS transistor T0 is connected to a power supply voltage terminal VCC.

<Method of Manufacturing Semiconductor Integrated Circuit>

An example of a method of manufacturing the semiconductor integrated circuit according to the embodiment of the present invention is illustrated below with reference to FIG. 3 to FIG. 17.

Figure 3:
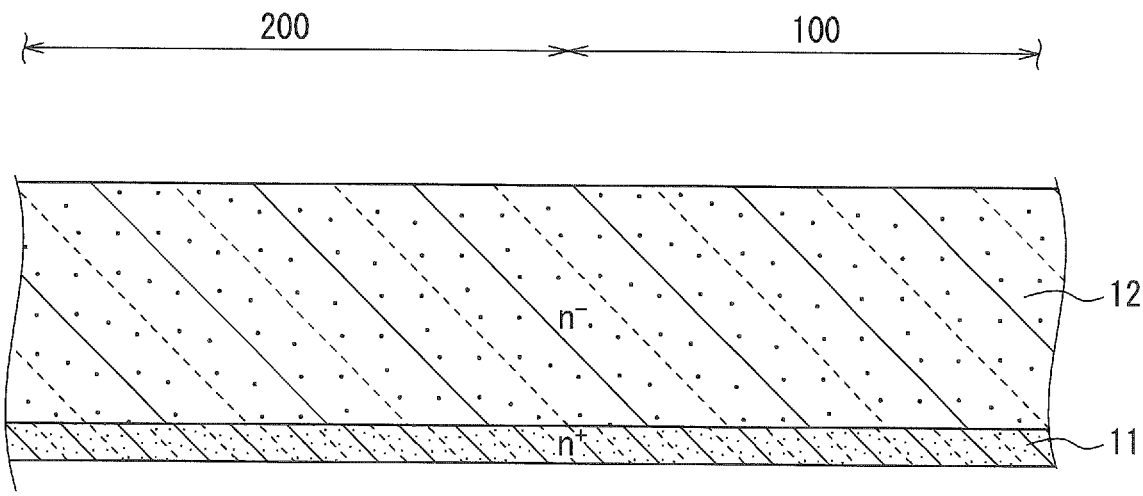
FIG. 3 is a cross-sectional view illustrating a process of manufacturing the semiconductor integrated circuit according to the embodiment of the present invention.

First, a semiconductor substrate (Si wafer) made of silicon (Si) of $n^+$-type is prepared, and the semiconductor layer 12 of $n^+$-type is epitaxially grown on the semiconductor substrate. The thickness of the semiconductor substrate is adjusted to be used as the rear surface contact layer 11 as illustrated in FIG. 3, so as to form the semiconductor base body (11, 12) having a two-layer structure in which the semiconductor layer 12 of $n^-$-type is epitaxially grown on the rear surface contact layer 11. The adjustment of the thickness of the semiconductor substrate may be, and is typically performed in the latter stage of a series of steps illustrated below.

Alternatively, the rear surface contact layer 11 as a diffusion layer of $n^+$-type may be formed on the rear surface of a semiconductor substrate (Si wafer) of $n^-$-type to be used as the semiconductor layer 12 by ion implantation or thermal diffusion so as to implement the semiconductor base body (11, 12). When the thickness of the semiconductor substrate used as the semiconductor layer 12 is critical, the rear surface contact layer 11 of $n^+$-type can be formed on the rear surface of the semiconductor substrate by ion implantation or thermal diffusion after the thickness of the semiconductor substrate as the semiconductor layer 12 is adjusted in the latter stage of the process. The adjustment of the thickness may be performed such that a Si wafer is attached to the top surface of the semiconductor layer 12 and is then reinforced. When the semiconductor layer 12 is epitaxially grown on the rear surface contact layer 11, the thickness of the semiconductor substrate used as the rear surface contact layer 11 can also be adjusted in the latter stage of the process.

Figure 4:
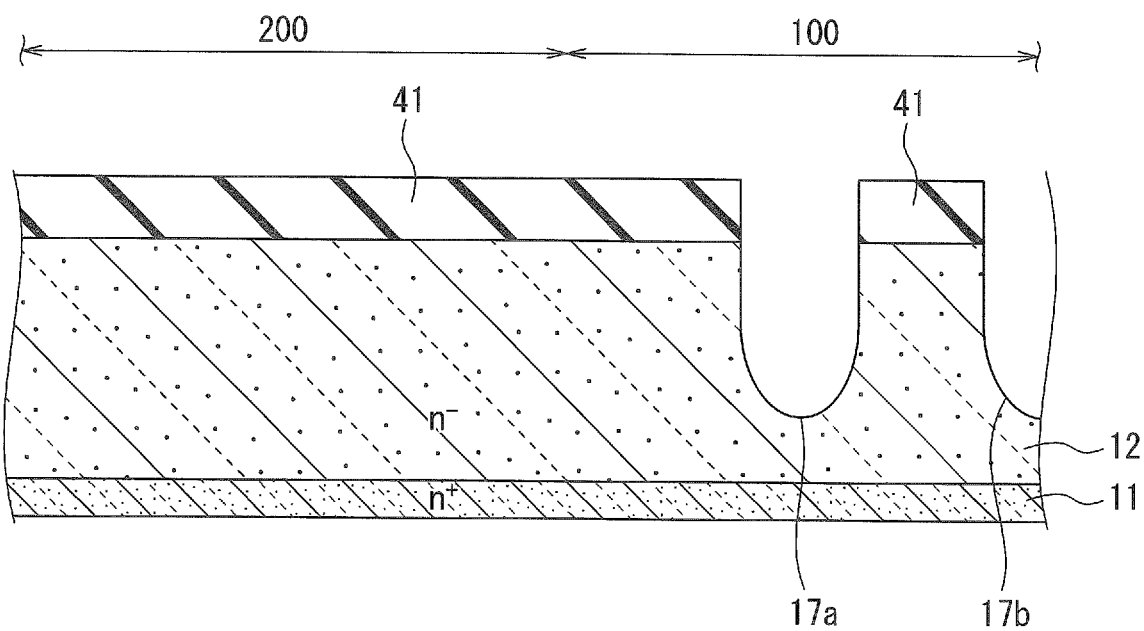
FIG. 4 is a cross-sectional view, continued from FIG. 3, illustrating the process of manufacturing the semiconductor integrated circuit according to the embodiment of the present invention.

Next, an etching passivation film 41 such as an oxide film is deposited on the top surface of the semiconductor layer 12 by a method such as chemical vapor deposition (CVD). The etching passivation film 41 is delineated by photolithography and dry etching such as reactive ion etching (RIE). Using the delineated etching passivation film 41 as a mask for etching, the trenches 17a and 17b are selectively dug in the upper portion of the semiconductor layer 12 by dry etching such as RIE, as illustrated in FIG. 4. The etching passivation film 41 used as a mask for etching is then removed.

Figure 5:
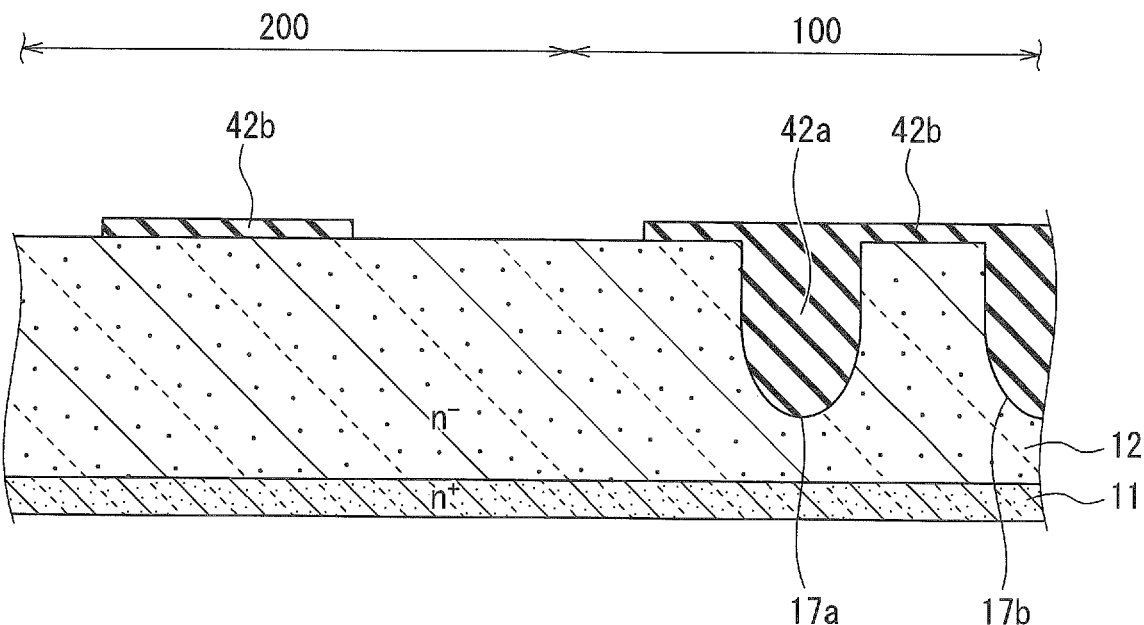
FIG. 5 is a cross-sectional view, continued from FIG. 4, illustrating the process of manufacturing the semiconductor integrated circuit according to the embodiment of the present invention.
Figure 6:
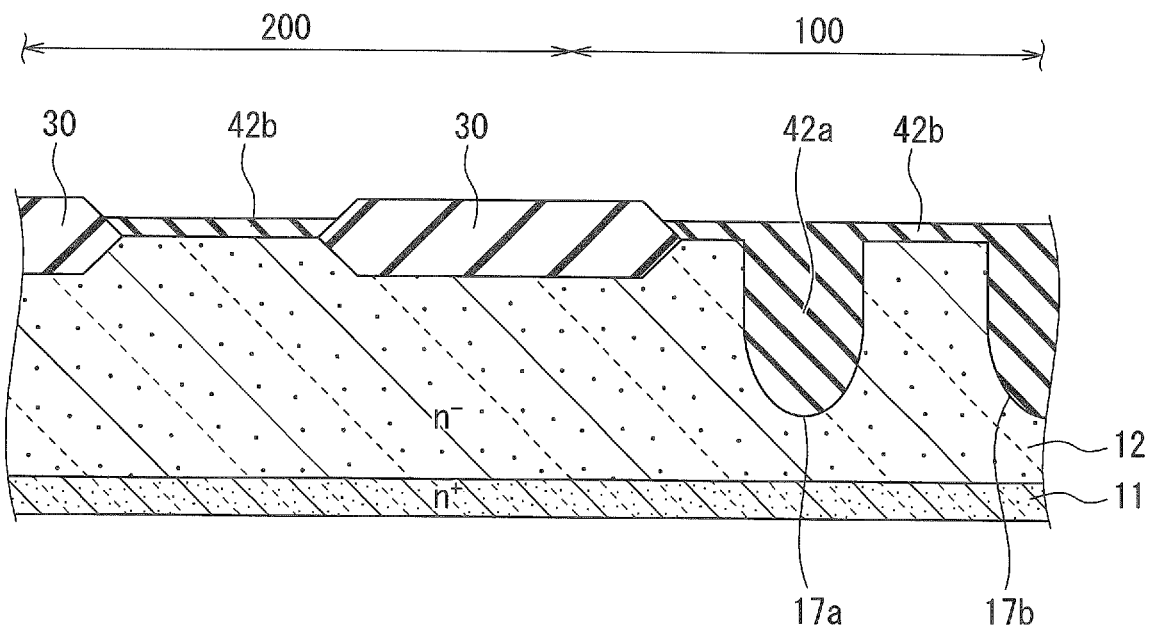
FIG. 6 is a cross-sectional view, continued from FIG. 5, illustrating the process of manufacturing the semiconductor integrated circuit according to the embodiment of the present invention.

Next, a buffer oxide film (not illustrated) is formed on the semiconductor layer 12 by a thermal oxidation method, for example, and an oxidation-resistant film 42 such as a silicon nitride ($Si_3N_4$) film is deposited on the buffer oxide film (not illustrated) by a deposition method such as CVD. The thickness of the oxidation-resistant film is determined in view of the groove width of the trenches 17a and 17b so as to completely fill the trenches 17a and 17b. In particular, the thickness of the oxidation-resistant film is set so as to be half or greater of the groove width of the trenches 17a and 17b. The oxidation-resistant film is then delineated by photolithography and dry etching such as RIE, as illustrated in FIG. 5. The field oxide film (LOCOS film) 30 serving as an element isolation region is selectively (locally) formed in openings of the delineated oxidation-resistant films 42a and 42b on the semiconductor layer 12 by local oxidation of silicon (LOCOS) using the oxidation-resistant films 42a and 42b as an oxidation-resistant mask, as illustrated in FIG. 6.

Next, a photoresist film 43 is coated on the oxidation-resistant films 42a and 42b and the field oxide film 30, and is subjected to photolithography so as to be delineated. Using the delineated photoresist film 43 as a mask for selective ion implantation, p-type impurity ions such as boron (B) ions or aluminum (Al) ions are selectively implanted by multiple implantation in the top surface of the semiconductor layer 12 so as to form the first well region 22 and the second well region 23. The multiple implantation is repeatedly performed under the different implantation conditions such as different implantation positions. As used herein, the term "implantation position" refers to a peak position of a chemical concentration profile of p-type impurity ions implanted in the semiconductor layer 12.

Figure 7:
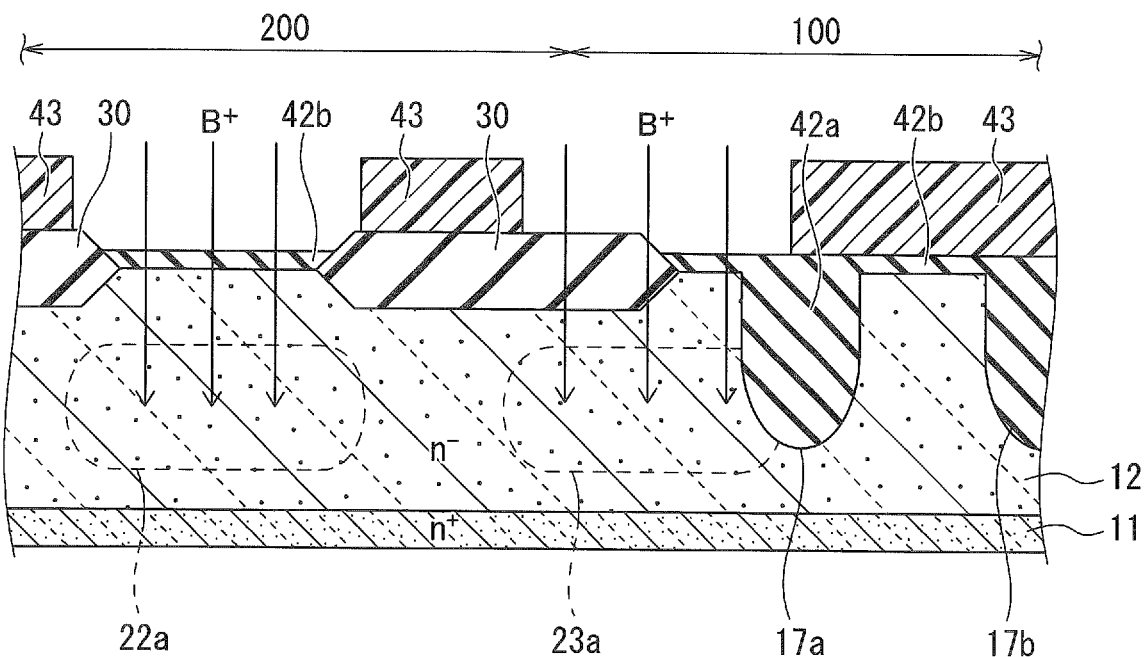
FIG. 7 is a cross-sectional view, continued from FIG. 6, illustrating the process of manufacturing the semiconductor integrated circuit according to the embodiment of the present invention.

The ion implantation step for forming the first well region 22 and the second well region 23 is illustrated below with a case of ion implantation having three steps (performed three times). As illustrated in FIG. 7, using the delineated photoresist film 43 as a mask for selective ion implantation, first ion implantation regions 22a and 23a are formed in the lower stage (on the lower side). This ion implantation is performed at a high acceleration voltage (about 1 to 4 MeV, for example) so as to penetrate the oxidation-resistant films 42a and 42b and the field oxide film 30 to define lower deep portions in the semiconductor layer 12 as implantation positions. The first ion implantation region 22a in the lower stage can regulate a well breakdown-voltage (a parasitic structure breakdown-voltage) of the control element 201, for example.

Figure 8:
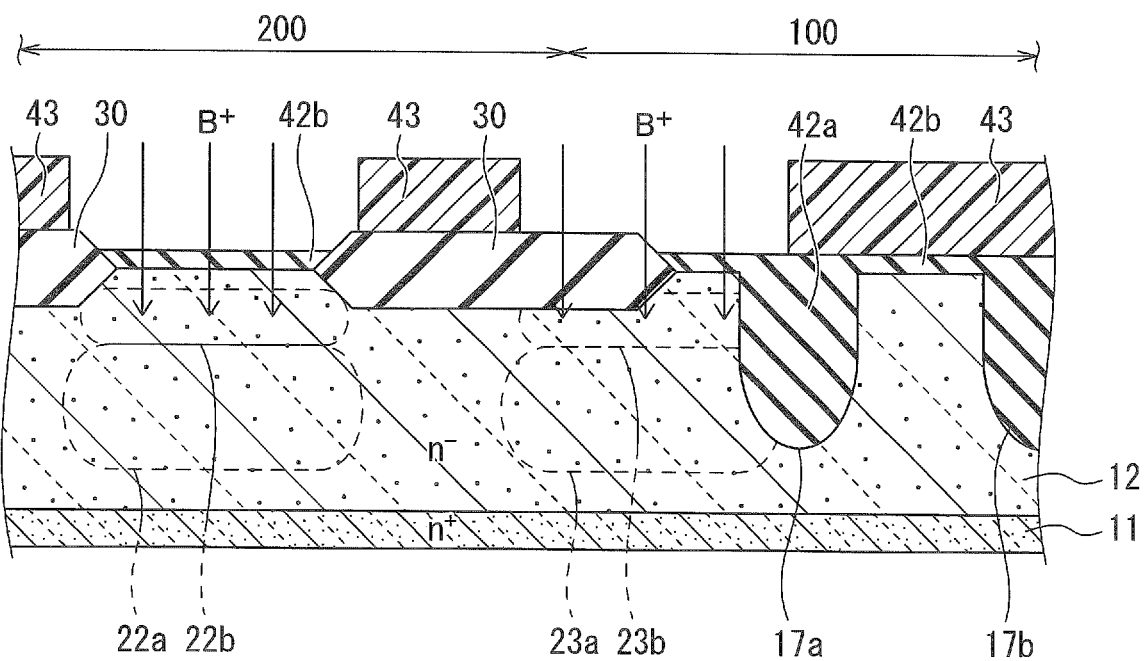
FIG. 8 is a cross-sectional view, continued from FIG. 7, illustrating the process of manufacturing the semiconductor integrated circuit according to the embodiment of the present invention.

Next, as illustrated in FIG. 8, using the same photoresist film 43 as a mask for selective ion implantation, first ion implantation regions 22b and 23b are formed in the intermediate stage (in the middle region). This ion implantation is performed at an intermediate acceleration voltage (about 0.3 to 1 MeV, for example) so as not to penetrate the oxidation-resistant film 42a but to penetrate the oxidation-resistant film 42b and the field oxide film 30 to define upper portions above the first ion implantation regions 22a and 23a in the semiconductor layer 12 as implantation positions. The first ion implantation region 22b in the intermediate stage can regulate a doping profile under the field oxide film 30.

Figure 9A:
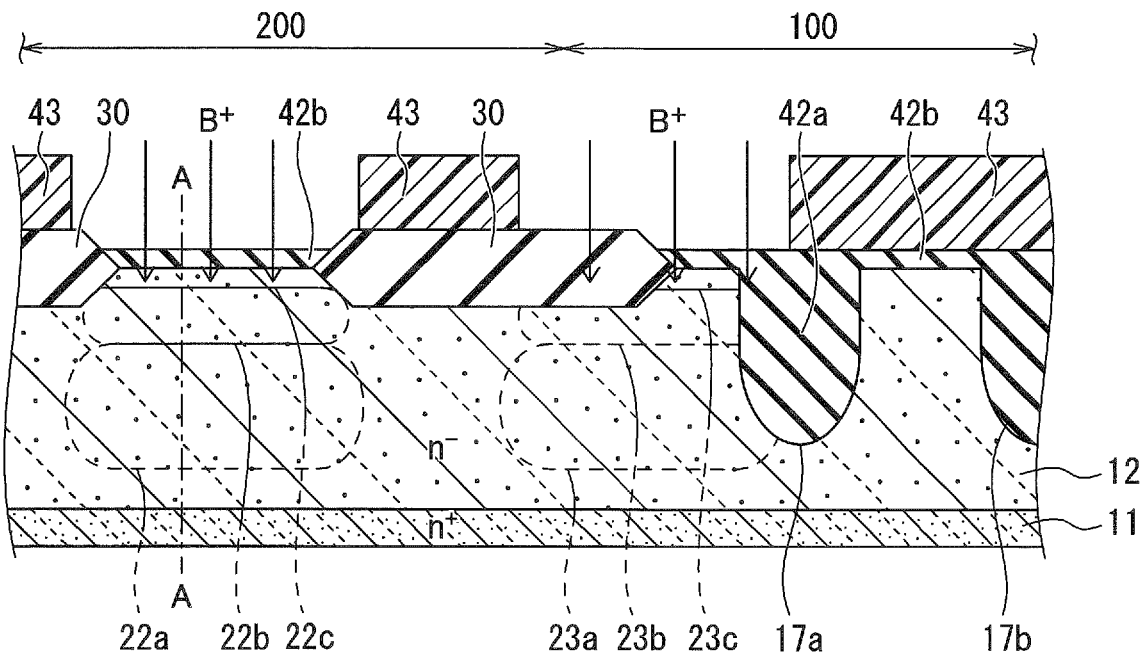
FIG. 9A is a cross-sectional view, continued from FIG. 8, illustrating the process of manufacturing the semiconductor integrated circuit according to the embodiment of the present invention.

Next, as illustrated in FIG. 9A, using the same photoresist film 43 as a mask for selective ion implantation, first ion implantation regions 22c and 23c are formed in the upper stage (on the upper side). This ion implantation is performed at a low acceleration voltage (about 300 keV of lower, for example) so as not to penetrate the field oxide film 30 or the oxidation-resistant film 42a but to penetrate the oxidation-resistant film 42b to define upper shallow portions adjacent to the top surface of the semiconductor layer 12 as implantation positions. The first ion implantation region 22c in the upper stage can regulate a threshold voltage of the control element 201.

While the ion implantation step for forming the first well region 22 and the second well region 23 is illustrated above with the case of conducting the ion implantation through the three steps (three times), the number of the steps of the multiple ion implantation is not limited to three. For example, the ion implantation may have two steps (two times), or may have four steps (four times) or more. The photoresist film 43 used as a mask for selective ion implantation is then removed.

Next, a photoresist film 44 is coated on the oxidation-resistant films 42a and 42b and the field oxide film 30, and is subjected to photolithography so as to be delineated. Using the delineated photoresist film 44 as a mask for selective ion implantation, p-type impurity ions such as boron (B) ions or aluminum (Al) ions are selectively implanted in the top surface of the semiconductor layer 12 to form the body region 13 by multiple implantation at an acceleration voltage so as not to penetrate the oxidation-resistant film 42a but to penetrate the oxidation-resistant film 42b. The ion implantation step for forming the body region 13 is also repeatedly performed under the different implantation conditions, as in the case of the ion implantation step for forming the first well region 22 and the second well region 23. For example, the body region 13 is formed by the multiple implantation in the ion implantation process such that the deepest implantation position differs from the deepest implantation positions of the first ion implantation regions 22a and 23a.

Figure 10:
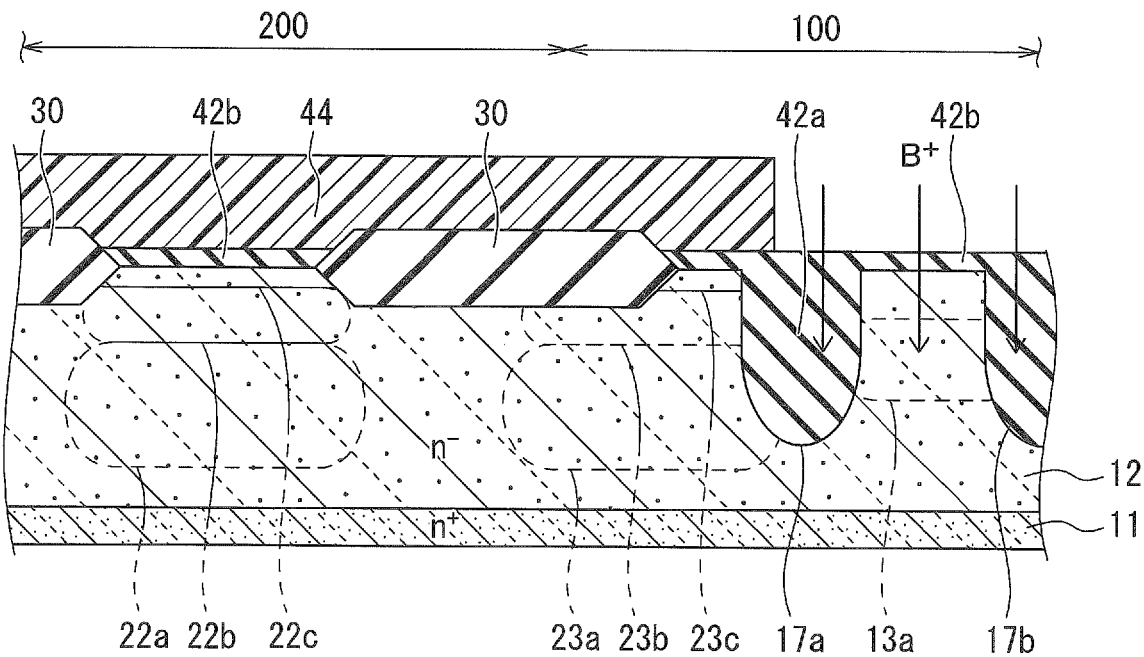
FIG. 10 is a cross-sectional view, continued from FIG. 9A, illustrating the process of manufacturing the semiconductor integrated circuit according to the embodiment of the present invention.

For example, as illustrated in FIG. 10, a second ion implantation region 13a is formed by ion implantation using the photoresist film 44 as a mask for selective ion implantation. This ion implantation is performed at a high acceleration voltage set in a range of about 1 to 4 MeV so as not to penetrate the oxidation-resistant film 42a but to penetrate the oxidation-resistant film 42b to define a relatively deep inner portion in the semiconductor layer 12 as an implantation position. The second ion implantation region 13a in the lower stage is formed at the implantation position shallower than the bottom portions of the trenches 17a and 17b. The second ion implantation region 13a in the lower stage can regulate a breakdown-voltage of the output-stage element 101.

Figure 11:
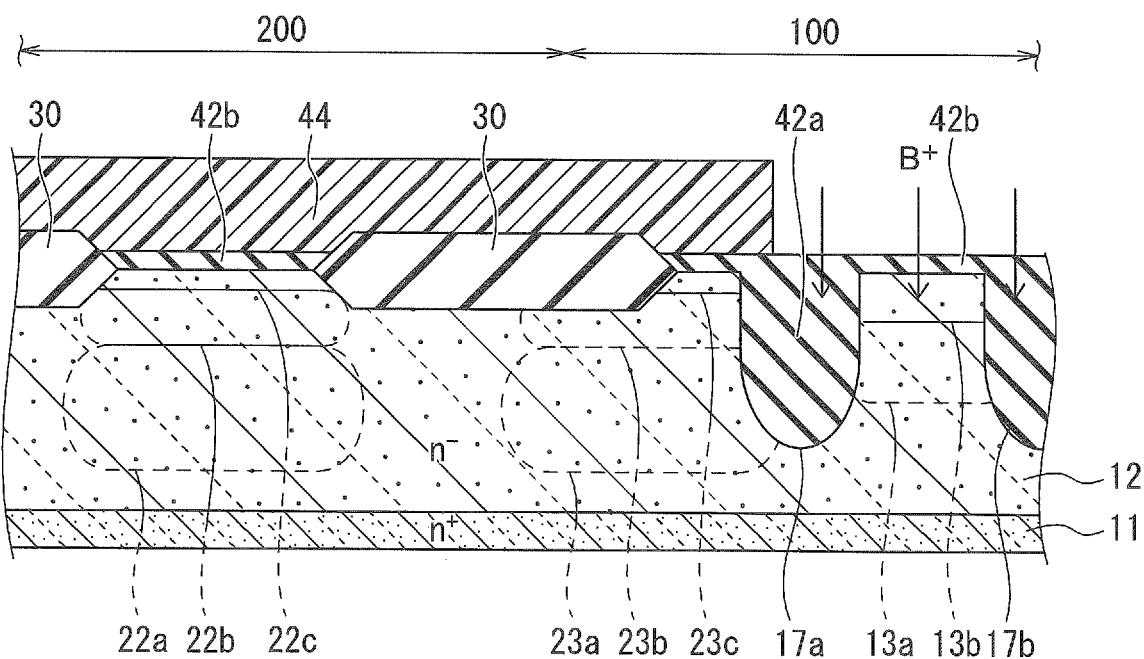
FIG. 11 is a cross-sectional view, continued from FIG. 10, illustrating the process of manufacturing the semiconductor integrated circuit according to the embodiment of the present invention.

Next, as illustrated in FIG. 11, using the same photoresist film 44 as a mask for selective ion implantation, a second ion implantation region 13b is formed in the upper stage. This ion implantation is performed at an intermediate acceleration voltage set in a range of about 0.3 to 1 MeV so as not to penetrate the oxidation-resistant film 42a but to penetrate the oxidation-resistant film 42b to define a shallow portion adjacent to the top surface of the semiconductor layer 12 as an implantation position. The second ion implantation region 13b in the upper stage can regulate a threshold voltage of the output-stage element 101. While the ion implantation step for forming the body region 13 in the output-stage element 101 is illustrated above with the case of conducting the multiple ion implantation through the two steps (two times), the number of the steps of the multiple ion implantation is not limited to two. For example, the ion implantation may have three steps (three times) or more.

For the implementation of the output-stage element 101, the body region 13 needs to be formed to be shallower than the trenches 17a and 17b, and should not be provided at the bottom portions of the trenches 17a and 17b. If the ion implantation is performed after the oxidation-resistant films 42a and 42b are removed, the trenches 17a and 17b need to be covered with photoresist films for passivation before the ion implantation. The thickness of the photoresist films to be used is set to be about several micrometers so as not to allow impurity ions to penetrate the photoresist films during the ion implantation at a high acceleration voltage. The formation of the photoresist films only in the trenches 17a and 17b complicates the processing because of the problem with the aspect ratio to be dealt with.

In contrast, since the method of manufacturing the semiconductor integrated circuit according to the embodiment performs the ion implantation before the removal of the oxidation-resistant films 42a and 42b, the trenches 17a and 17b are completely filled with the oxidation-resistant film 42a, as illustrated in FIG. 10 and FIG. 11. The oxidation-resistant film 42a with the thickness effectively increased in the trenches 17a and 17b thus can be used as a mask for selective ion implantation. The ion implantation is performed at an acceleration voltage so as to penetrate the oxidation-resistant film 42b provided on the semiconductor layer 12 without penetrating the oxidation-resistant film 42a with the thickness effectively increased in the trenches 17a and 17b. The acceleration voltage determined as appropriate can allow the impurity ions to be implanted in the portion other than the bottom portions of the trenches 17a and 17b in a self-aligned manner due to the photoresist film 44 greatly open in the region in which the trenches 17a and 17b are formed.

The photoresist film 44 used as a mask for selective ion implantation is then removed. The multiple ion implantation for forming the body region 13 may be performed before the multiple ion implantation for forming the first well region 22 and the second well region 23.

Next, the oxidation-resistant films 42a and 42b are removed. The oxidation-resistant films 42a and 42b may be removed before the steps of the multiple ion implantation for forming the first well region 22 and the second well region 23 and the multiple ion implantation for forming the body region 13.

Figure 12:
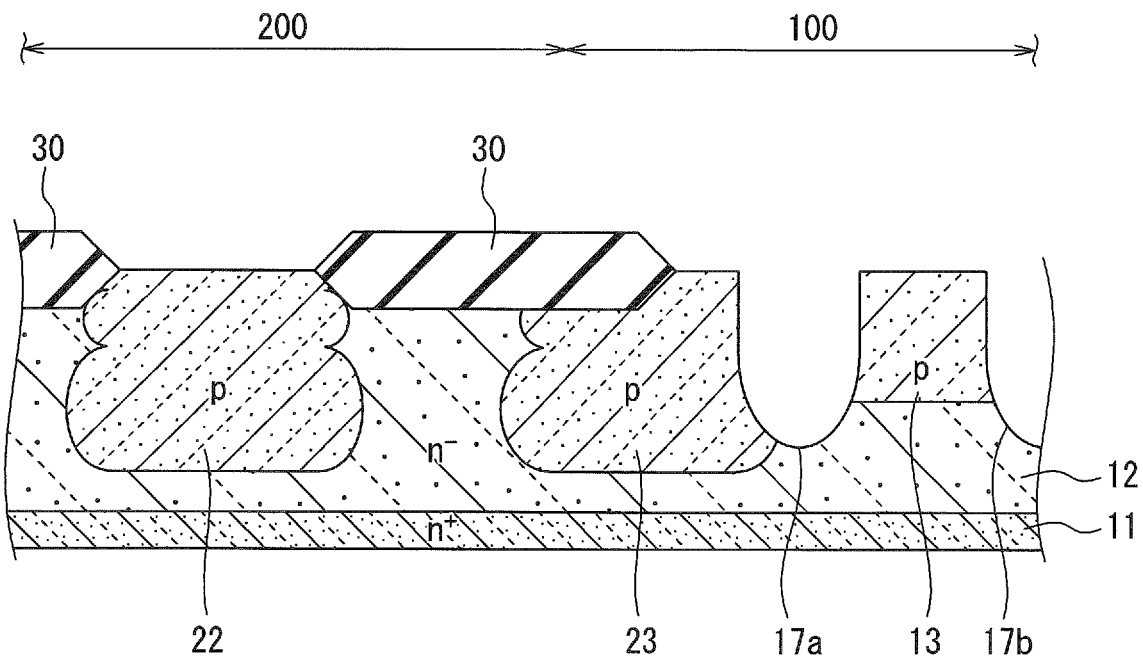
FIG. 12 is a cross-sectional view, continued from FIG. 11, illustrating the process of manufacturing the semiconductor integrated circuit according to the embodiment of the present invention.

The impurity ions in the first ion implantation region 22a in the lower stage, the first ion implantation region 22b in the intermediate stage, and the first ion implantation region 22c in the upper stage are activated by annealing for a short period of time, so as to form the first well region 22 as illustrated in FIG. 12. Similarly, the impurity ions in the first ion implantation region 23a in the lower stage, the first ion implantation region 23b in the intermediate stage, and the first ion implantation region 23c in the upper stage are activated so as to form the second well region 23. In addition, the impurity ions in the second ion implantation region 13a in the lower stage and the second ion implantation region 13b in the upper stage are activated so as to form the body region 13. The annealing conditions about the temperature and the time at this point are set as appropriate so as to prevent further diffusion of the impurity ions to keep the impurity profile upon the impurity implantation, reducing a property variation and suppressing diffusion in the lateral direction to achieve the fineness.

Figure 9B:
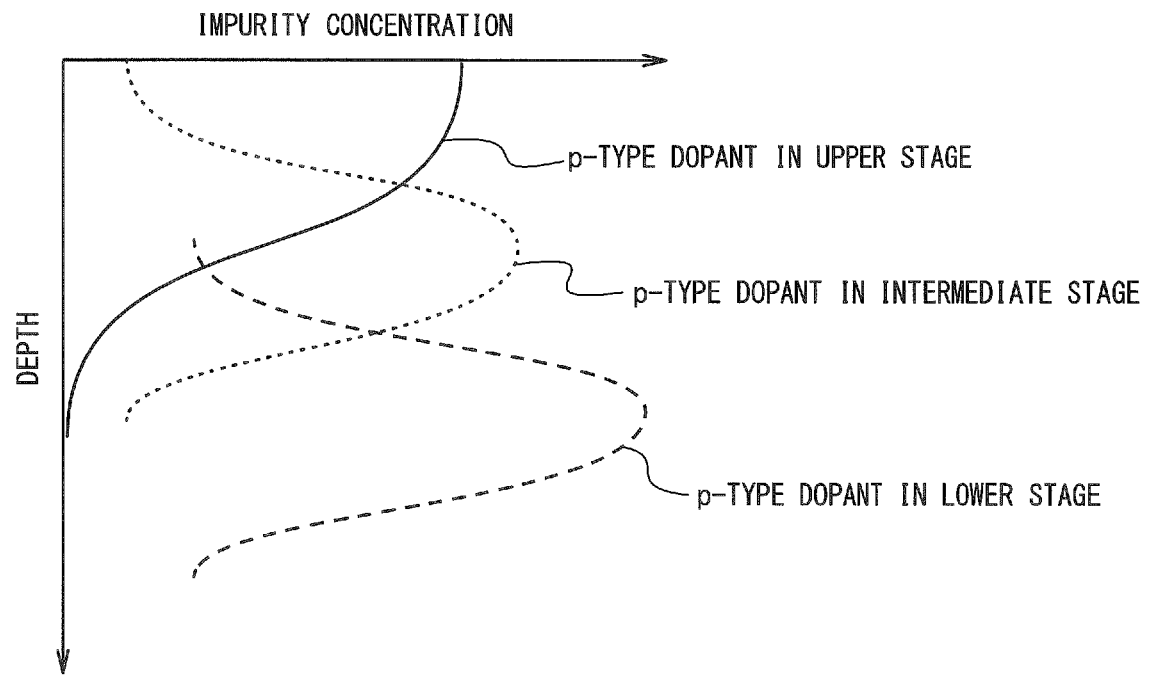
FIG. 9B is a graph illustrating an impurity concentration distribution in a depth direction from the surface of a horizontal semiconductor element as a control element according to the embodiment of the present invention.

FIG. 9B illustrates a doping profile of the p-type impurity ions in the first ion implantation region 22c in the shallow upper stage (the solid line), a doping profile of the p-type impurity ions in the first ion implantation region 22b in the intermediate stage (the dotted line), and a doping profile of the p-type impurity ions in the first ion implantation region 22a in the deep lower stage (the broken line) in the semiconductor layer 12, taken along line A-A in FIG. 9A. The respective ion implantation positions in the upper, intermediate, and lower stages correspond to the peek positions of the respective doping profiles.

As illustrated in FIG. 9B, the position of the peak concentration of the p-type impurity ions in the first ion implantation region 22a in the lower stage is deeper than the position of the peak concentration of the p-type impurity ions in the first ion implantation region 22b in the intermediate stage. The position of the peak concentration of the p-type impurity ions in the first ion implantation region 22b in the intermediate stage is deeper than the position of the peak concentration of the p-type impurity ions in the first ion implantation region 22c in the upper stage. The peak concentration of the p-type impurity ions in the first ion implantation region 22a in the lower stage is higher than the peak concentration of the p-type impurity ions in the first ion implantation region 22b in the intermediate stage. The peak concentration of the p-type impurity ions in the first ion implantation region 22b in the intermediate stage is higher than the peak concentration of the p-type impurity ions in the first ion implantation region 22c in the upper stage.

Figure 13:
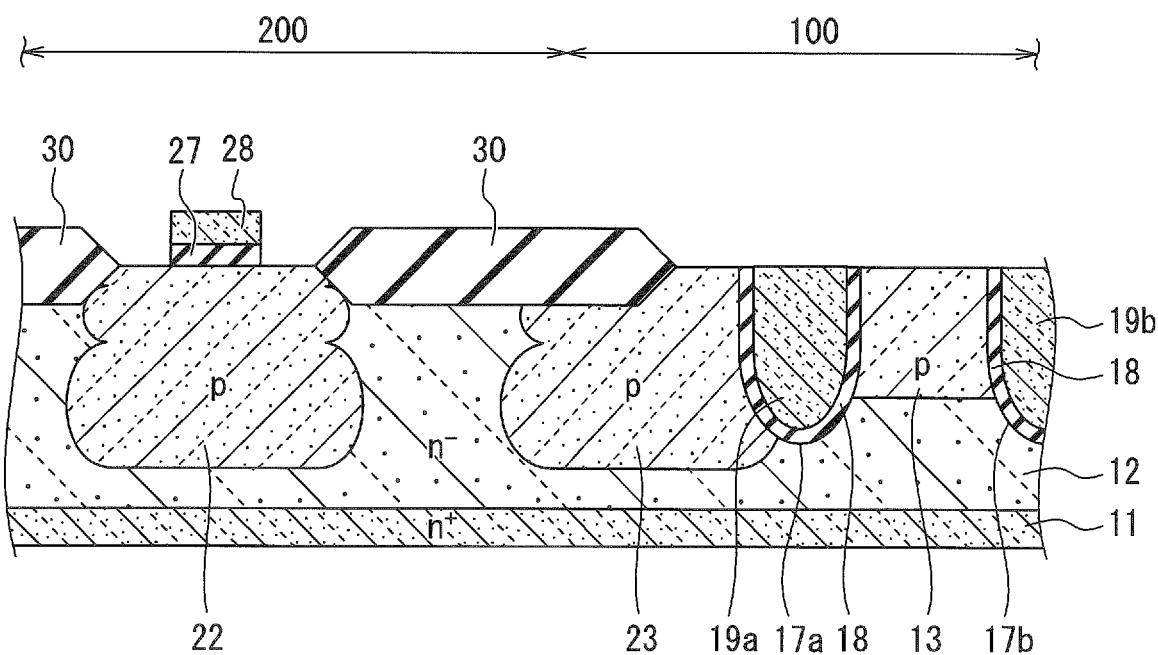
FIG. 13 is a cross-sectional view, continued from FIG. 12, illustrating the process of manufacturing the semiconductor integrated circuit according to the embodiment of the present invention.

Next, the gate insulating film 27 is formed on the first well region 22 exposed between the field oxide film 30, and the gate insulating film 18 is formed on the body region 13 and on the inner walls of the trenches 17a and 17b by thermal oxidation. Next, a DOPOS layer is deposited on the field oxide film 30, on the gate insulating film 27, on the gate insulating film 18, and in the trenches 17a and 17b by a deposition method such as CVD. A photoresist film is coated on the DOPOS layer, and is delineated by photolithography. Using the delineated photoresist film as an etching mask, the DOPOS layer, the gate insulating film 27, and the gate insulating film 18 are delineated by dry etching such as RIE. The photoresist film used as an etching mask is then removed. The gate electrode 28 and the gate electrodes 19a and 19b each made of the DOPOS layer are thus formed, as illustrated in FIG. 13.

Figure 14:
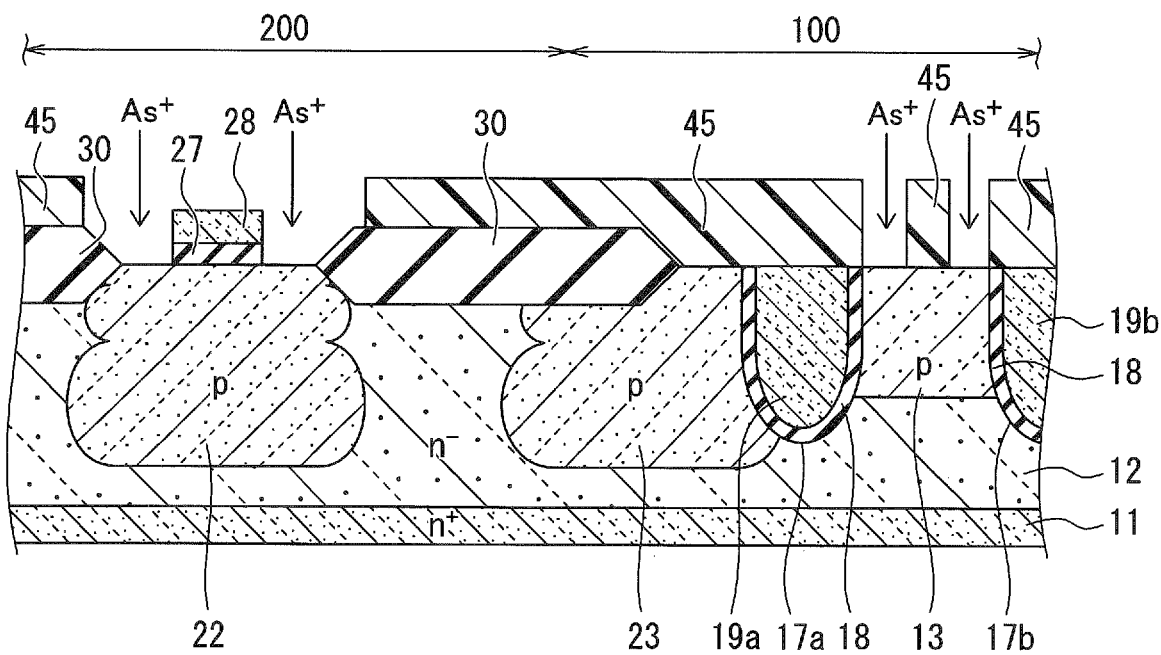
FIG. 14 is a cross-sectional view, continued from FIG. 13, illustrating the process of manufacturing the semiconductor integrated circuit according to the embodiment of the present invention.
Figure 15:
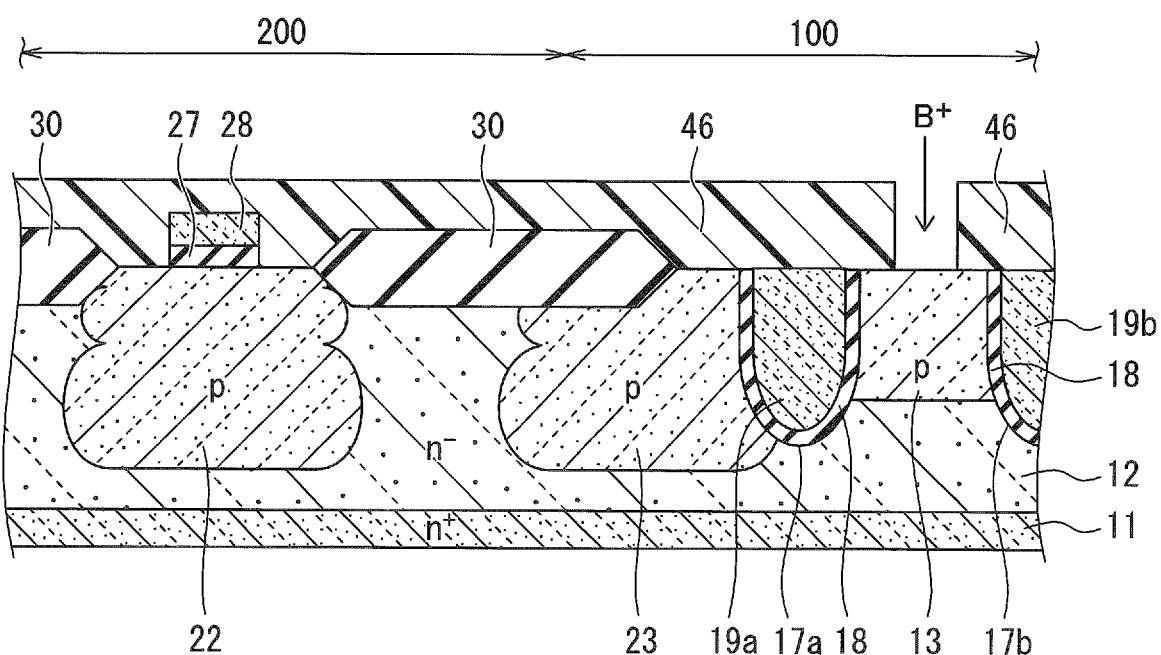
FIG. 15 is a cross-sectional view, continued from FIG. 14, illustrating the process of manufacturing the semiconductor integrated circuit according to the embodiment of the present invention.

Next, as illustrated in FIG. 14, a mask for selective ion implantation 45 having openings are formed on the body region 13 in the output-stage element 101 and on the first well region 22 in the control element 201 by photolithography. Using the gate electrode 28 as a mask for self-alignment exposed to the openings of the mask for selective ion implantation 45, n-type impurity ions such as arsenic (As) ions or phosphorus (P) ions are selectively implanted in the top surface of the body region 13. Next, as illustrated in FIG. 15, a mask for selective ion implantation 46 having an opening above the body region 13 in the output-stage element 101 is formed by photolithography. Using the mask for selective ion implantation 46, p-type impurity ions such as boron (B) ions or aluminum (Al) ions are selectively implanted in the top surface of the body region 13.

Figure 16:
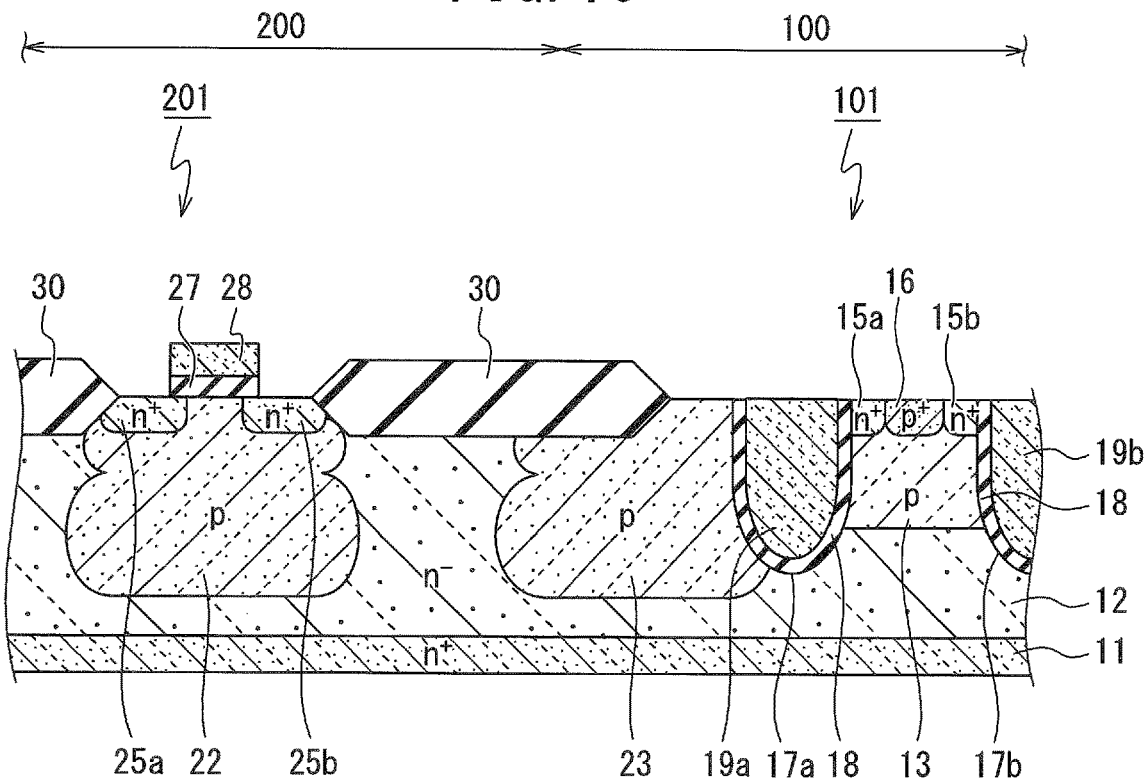
FIG. 16 is a cross-sectional view, continued from FIG. 15, illustrating the process of manufacturing the semiconductor integrated circuit according to the embodiment of the present invention.

After the mask for selective ion implantation 46 is removed, the p-type and n-type impurity ions are activated and thermally diffused by annealing. The first main electrode regions 15a and 15b of $n^+$-type and the base contact region 16 of $p^+$-type are thus formed in the output-stage element 101 of the output unit 100. The first terminal region 25a and the second terminal region 25b of $n^+$-type are also formed in the control element 201 of the circuit unit 200. The first main electrode regions 15a and 15b of $n^+$-type are formed so as to have a depth shallower than the implantation position of the second ion implantation region 13b in the upper stage of the body region 13. The first well region 22, the second well region 23, and the body region 13 may be formed by an annealing step as illustrated in FIG. 16, while omitting the annealing step illustrated in FIG. 12.

The manufacturing method is illustrated above with the case of forming the trenches 17a and 17b first, and further forming the first main electrode regions 15a and 15b and the base contact region 16 after filling the trenches 17a and 17b with the DOPOS layer, but is not limited to this case. For example, the trenches 17a and 17b may be formed after the first main electrode regions 15a and 15b and the base contact region 16 are formed. The first main electrode regions 15a and 15b may be formed independently of the first terminal region 25a and the second terminal region 25b.

Next, the interlayer insulating film 20 is deposited by a deposition method such as CVD. The surface of the interlayer insulating film 20 is flattened by a method such as chemical mechanical polishing (CMP). A photoresist film is coated on the flattened interlayer insulating film 20, and is delineated by photolithography. Using the delineated photoresist film as an etching mask, the interlayer insulating film 20 is delineated by dry etching such as RIE so as to open contact holes.

Figure 17:
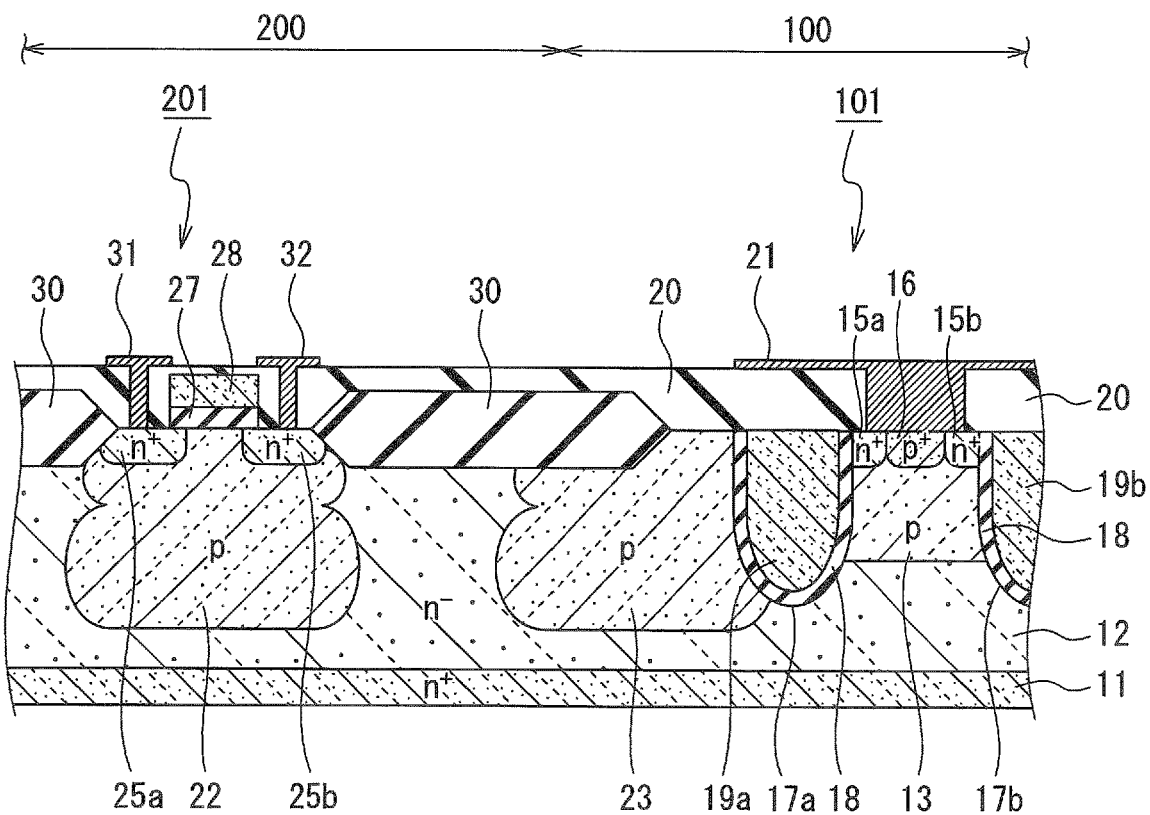
FIG. 17 is a cross-sectional view, continued from FIG. 16, illustrating the process of manufacturing the semiconductor integrated circuit according to the embodiment of the present invention.

Next, a metallic film such as Al is deposited by sputtering or evaporation. A photoresist film is coated on the metallic film, and is delineated by photolithography. Using the delineated photoresist film as an etching mask, the metallic film is delineated by dry etching such as RIE. The gate electrode wiring (not illustrated), the first circuit terminal wiring 31, and the second circuit terminal wiring 32 are thus formed as illustrated in FIG. 17. Alternatively, the gate electrode wiring (not illustrated), the first circuit terminal wiring 31, and the second circuit terminal wiring 32 may be formed in a salicide step using a silicide of refractory metal such as W, Mo, and Ti. The thickness of the rear surface contact layer 11 is then adjusted as necessary. The rear surface electrode 10 made of Al, for example, is deposited on the rear surface of the rear surface contact layer 11 by sputtering or evaporation, so as to complete the semiconductor integrated circuit illustrated in FIG. 1.

<Comparative Example>

Figure 18:
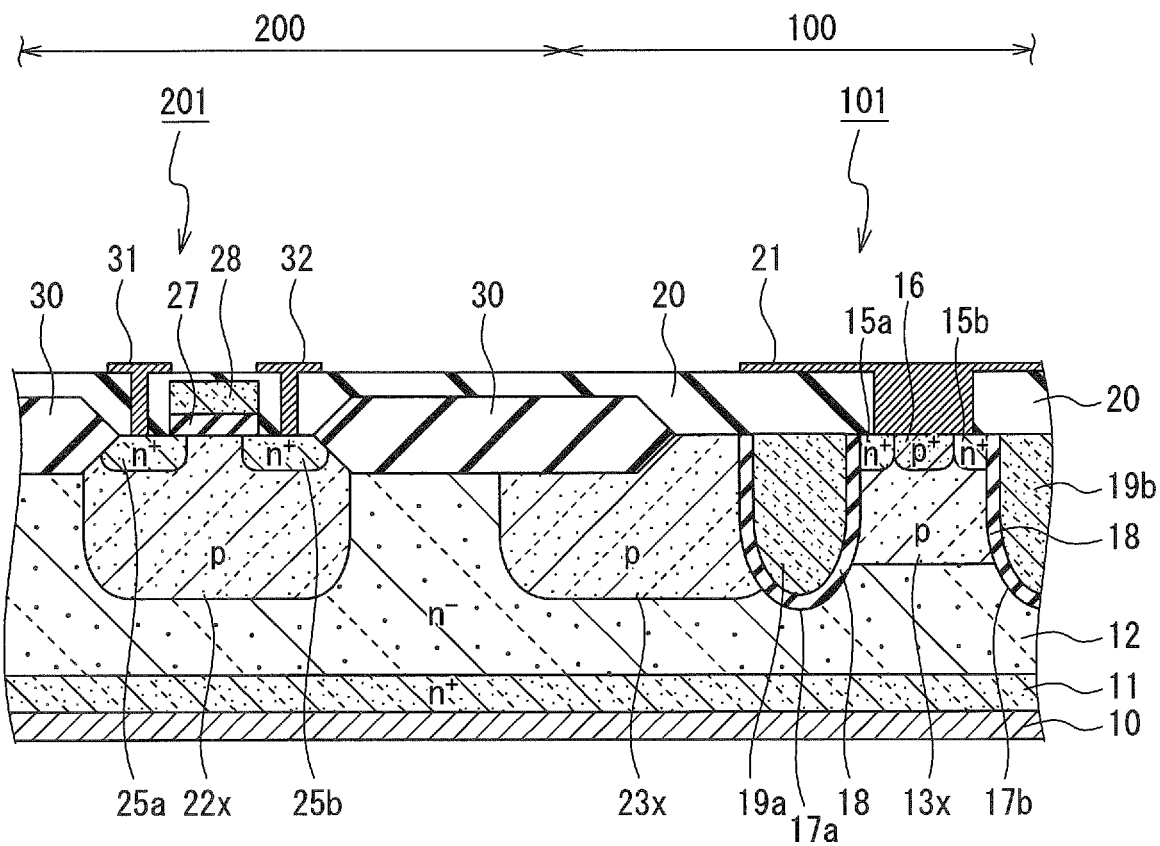
FIG. 18 is a cross-sectional view of main components illustrating a semiconductor integrated circuit according to a comparative example.

A semiconductor integrated circuit of a comparative example is described below. The semiconductor integrated circuit of the comparative example differs from the semiconductor integrated circuit according to the embodiment of the present invention in that the body region 13x in the output unit 100 and the first well region 22x and the second well region 23x in the circuit unit 200 illustrated in FIG. 18 are each formed by single ion implantation and annealing at a high temperature for a long period of time. The body region 13x, the first well region 22x, and the second well region 23x each have a doping profile in a simple Gaussian distribution form in the depth direction.

A method of manufacturing the semiconductor integrated circuit of the comparative example is described below with reference to FIG. 19 to FIG. 26. First, the semiconductor layer 12 of n⁻-type is epitaxially grown on the rear surface contact layer 11 of n⁺-type, so as to form the semiconductor base body (11, 12) having a two-layer structure, in the same manner as the step illustrated in FIG. 3 in the method of manufacturing the semiconductor integrated circuit according to the embodiment of the present invention.

Figure 19:
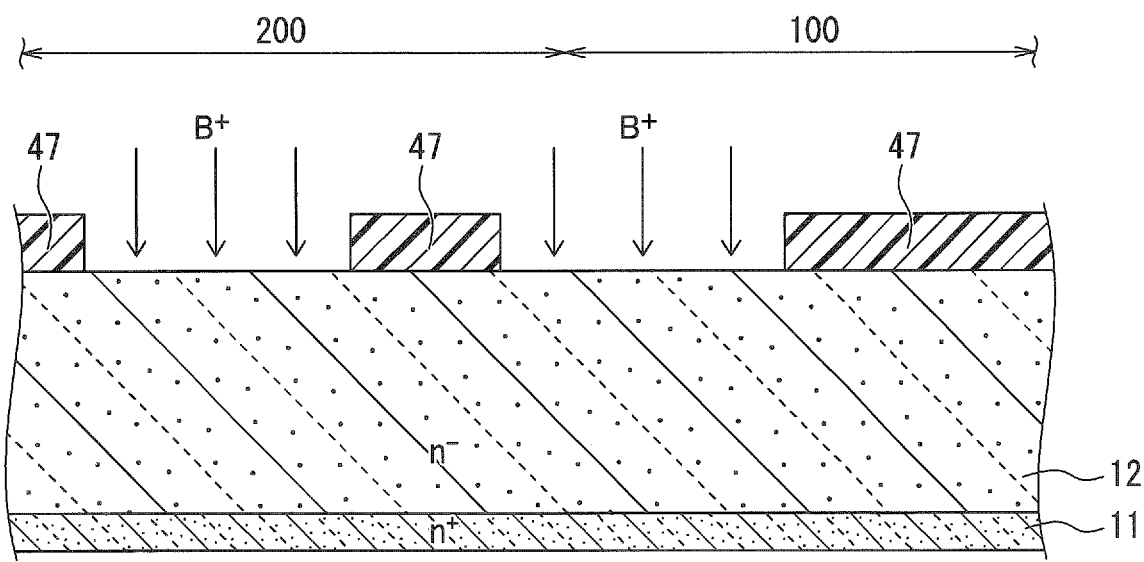
FIG. 19 is a cross-sectional view illustrating a process of manufacturing the semiconductor integrated circuit according to the comparative example.
Figure 20:
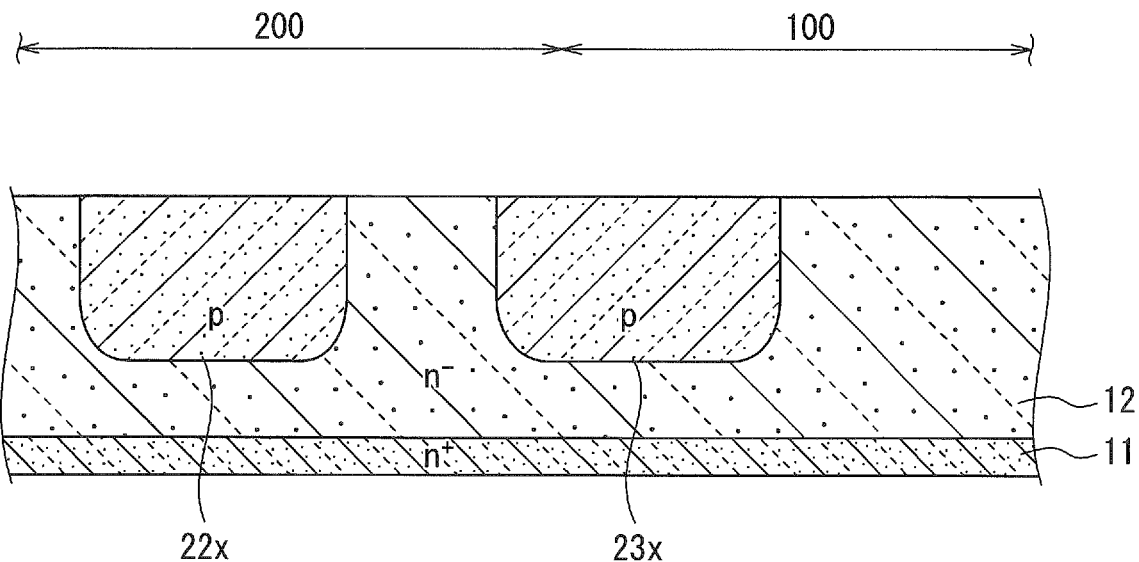
FIG. 20 is a cross-sectional view, continued from FIG. 19, illustrating the process of manufacturing the semiconductor integrated circuit according to the comparative example.

Next, as illustrated in FIG. 19, a photoresist film 47 is coated on the semiconductor layer 12, and is delineated by photolithography. Using the delineated photoresist film 47 as a mask for selective ion implantation, p-type impurity ions are selectively implanted in the top surface of the semiconductor layer 12. The photoresist film 47 is then removed. The impurity ions are activated and thermally diffused by annealing. This thermal diffusion is a drive-in step at a high temperature for a long period of time for forming the p-type first well region 22x and the p-type second well region 23x having a depth as illustrated in FIG. 20.

Figure 21:
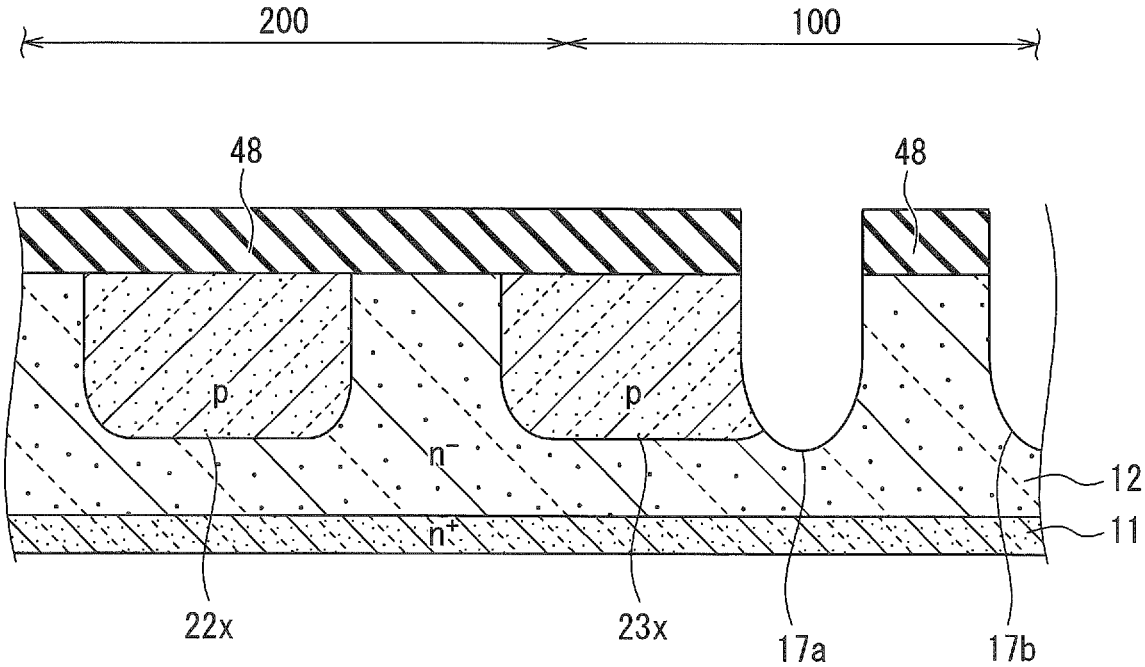
FIG. 21 is a cross-sectional view, continued from FIG. 20, illustrating the process of manufacturing the semiconductor integrated circuit according to the comparative example.

Next, an etching passivation film 48 such as an oxide film is deposited on the top surface of the semiconductor layer 12 by a deposition method such as CVD, and is delineated by photolithography and dry etching such as RIE. Using the delineated etching passivation film 48 as a mask for etching, the trenches 17a and 17b are dug in the upper portion of the semiconductor layer 12 by dry etching such as RIE, as illustrated in FIG. 21. The etching passivation film 48 is then removed.

Figure 22:
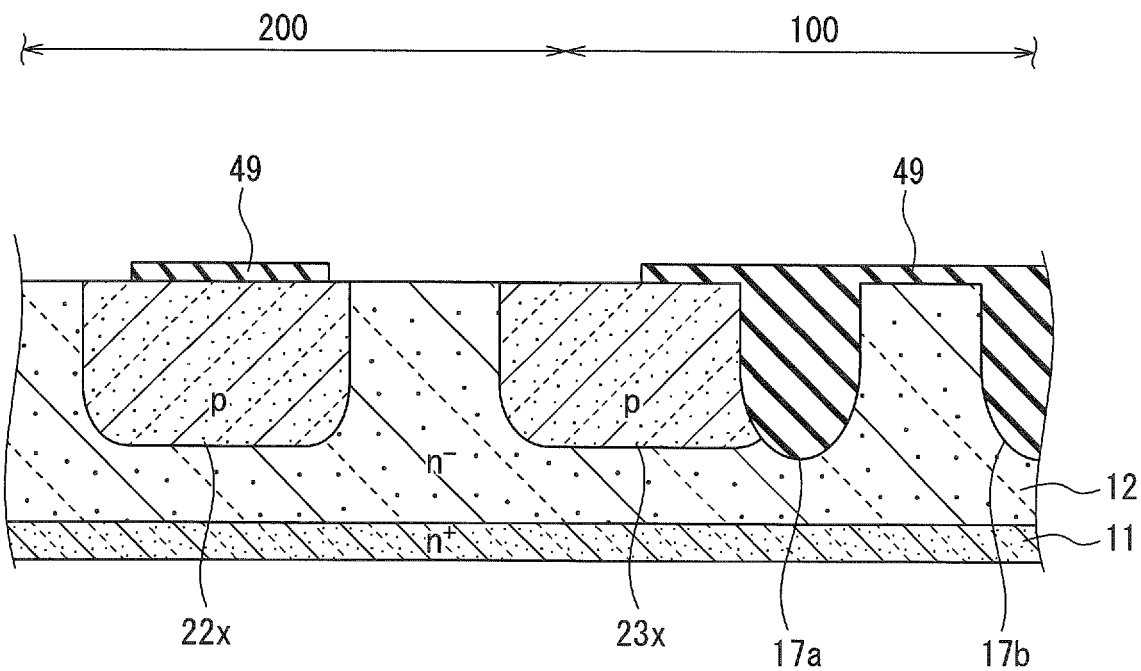
FIG. 22 is a cross-sectional view, continued from FIG. 21, illustrating the process of manufacturing the semiconductor integrated circuit according to the comparative example.
Figure 23:
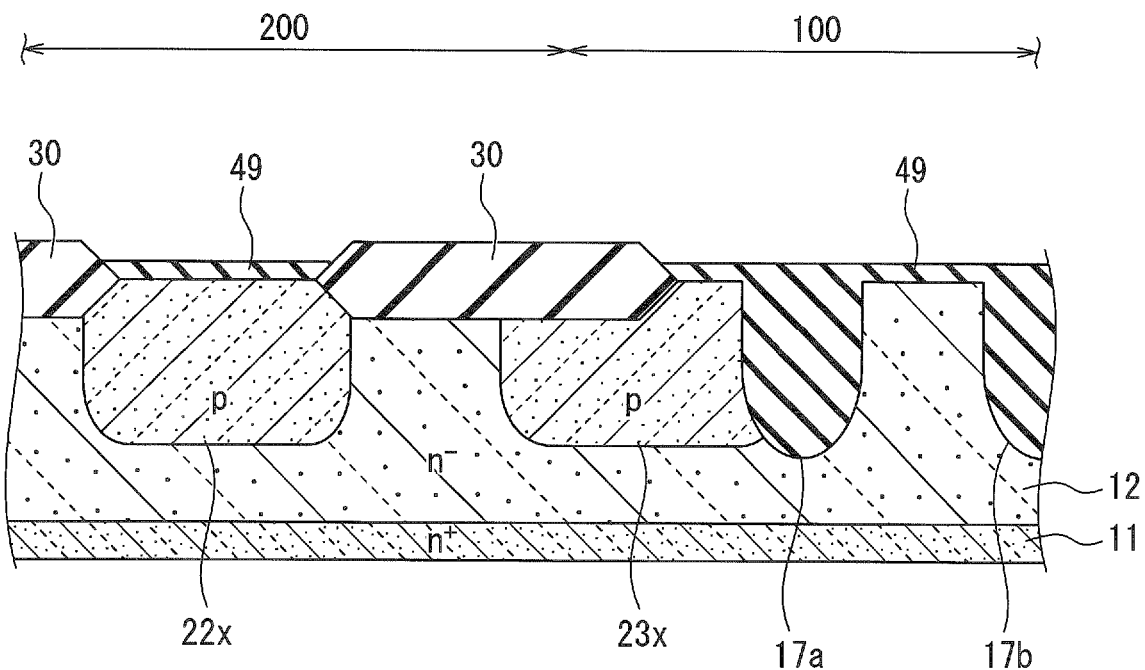
FIG. 23 is a cross-sectional view, continued from FIG. 22, illustrating the process of manufacturing the semiconductor integrated circuit according to the comparative example.

Next, an oxidation-resistant film 49 such as a $Si_3N_4$ film is deposited on the semiconductor layer 12 by a deposition method such as CVD. The oxidation-resistant film 49 is delineated by photolithography and dry etching, as illustrated in FIG. 22. The field oxide film 30 is selectively formed on the semiconductor layer 12 by LOCOS using the delineated oxidation-resistant film 49 as an oxidation-resistant mask, as illustrated in FIG. 23. The oxidation-resistant film 49 is then removed.

Figure 24:
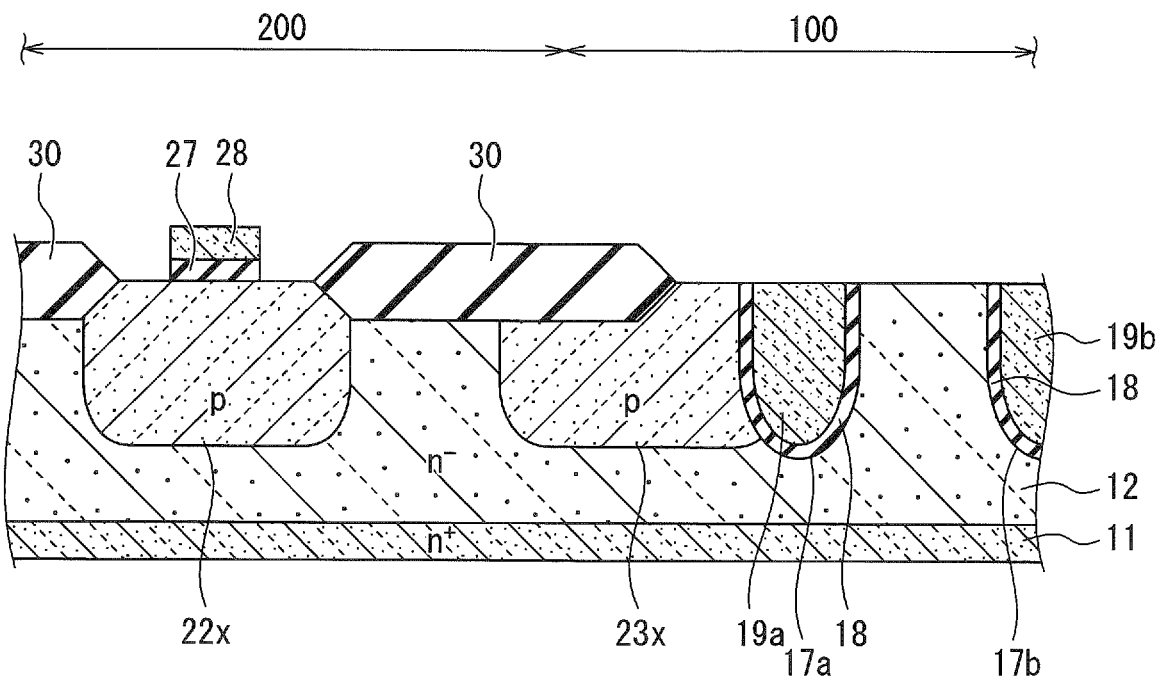
FIG. 24 is a cross-sectional view, continued from FIG. 23, illustrating the process of manufacturing the semiconductor integrated circuit according to the comparative example.

Next, the gate insulating film 27 is formed on the first well region 22x exposed between the field oxide film 30, and the gate insulating film 18 is formed on the inner walls of the trenches 17a and 17b by thermal oxidation. Next, a DOPOS layer is deposited on the field oxide film 30, on the gate insulating film 27, on the gate insulating film 18, and in the trenches 17a and 17b by a deposition method such as CVD. The DOPOS layer, the gate insulating film 27, and the gate insulating film 18 are delineated by photolithography and dry etching. The gate electrode 28 and the gate electrodes 19a and 19b each made of the DOPOS layer are thus formed, as illustrated in FIG. 24.

Figure 25:
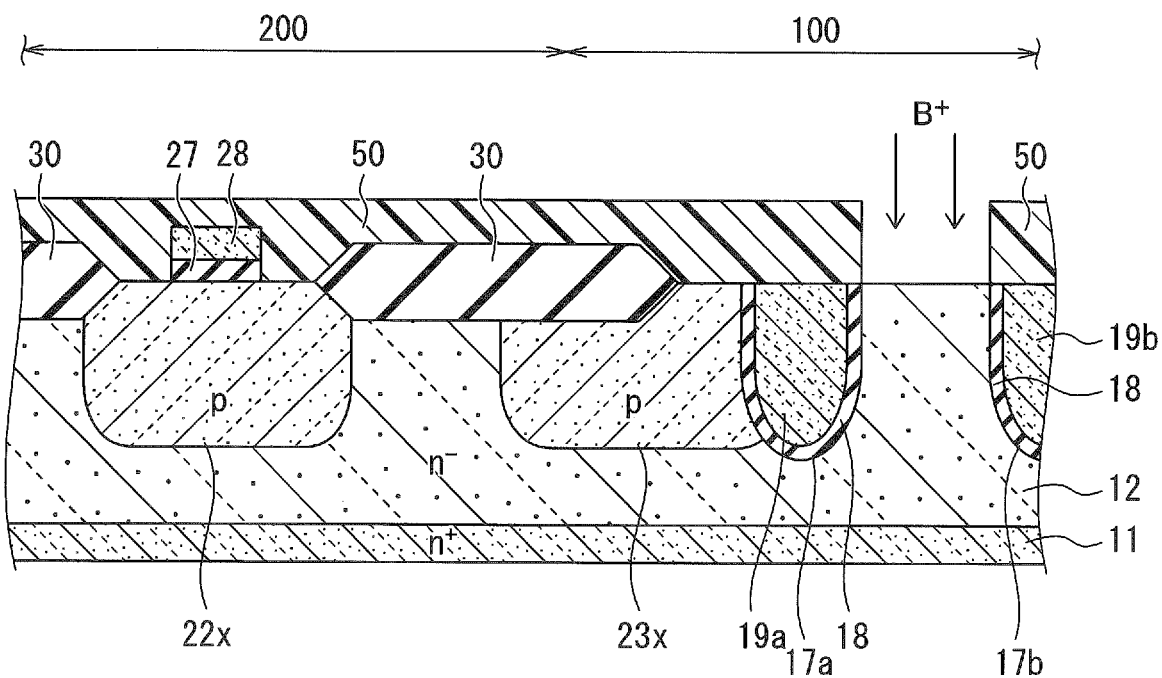
FIG. 25 is a cross-sectional view, continued from FIG. 24, illustrating the process of manufacturing the semiconductor integrated circuit according to the comparative example.
Figure 26:
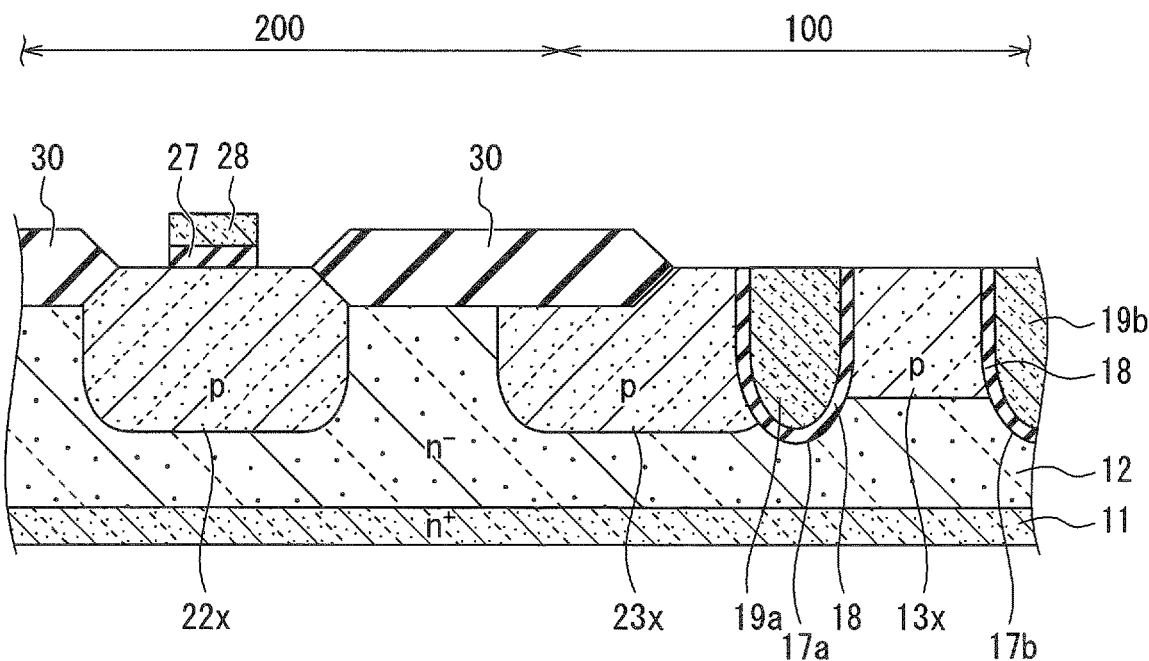
FIG. 26 is a cross-sectional view, continued from FIG. 25, illustrating the process of manufacturing the semiconductor integrated circuit according to the comparative example.

Next, as illustrated in FIG. 25, a photoresist film 50 is coated on the semiconductor layer 12, and is delineated by photolithography. Using the delineated photoresist film 50 as a mask for selective ion implantation, p-type impurity ions are selectively implanted in the top surface of the semiconductor layer 12. The photoresist film 50 used as a mask for selective ion implantation is then removed. The impurity ions are activated and thermally diffused by annealing at a high temperature for a long period of time. The body region 13x of p-type is thus formed as illustrated in FIG. 26. The following steps are the same as those illustrated from FIG. 14 in the method of manufacturing the semiconductor integrated circuit according to the embodiment of the present invention, and overlapping explanations are not repeated below.

The method of manufacturing the semiconductor integrated circuit of the comparative example repeats the annealing at a high temperature for a long period of time after the ion implantation for forming the first well region 22x and the second well region 23x of p-type and after the ion implantation for forming the body region 13x, leading to an increase in manufacture time. The repeated annealing causes a variation in impurity concentration of the first well region 22x, the second well region 23x, and the body region 13x to result in a variation in device characteristics.

In contrast, the method of manufacturing the semiconductor integrated circuit according to the embodiment of the present invention eliminates the annealing (drive-in) step at a high temperature for a long period of time, so as to reduce the manufacturing time and suppress lateral diffusion of impurity ions. For example, the elimination of the drive-in step at 1150° C. for three hours decreases the temperature to about 800° C. and reduces the time to about 30 minutes. The actual effect of the time reduction is much greater, since the drive-in step at a high temperature inevitably increases both the heating time and the cooling time. The suppression of the lateral diffusion can increase the aspect ratio of the first well region 22, the second well region 23, and the body region 13 defined by the dimensions in the depth direction with respect to the dimensions on the plane. The increase in the aspect ratio increases the efficiency of area usage of the output-stage element 101 and the control element 201, so as to manufacture the semiconductor integrated circuit with a high-density integration structure in which the output-stage element 101 and the control element 201 are integrated in a single chip. The elimination of the drive-in step at a high temperature for a long period of time can also reduce damage such as process-derived defects of the stacked layers caused by thermal deformation, for example, and further prevent a variation in impurity concentration in the first well region 22, the second well region 23, and the body region 13. The reduction in damage such as process-derived defects of the stacked layers can further avoid leaking current, so as to improve the electrical characteristics of the semiconductor integrated circuit accordingly.

(First Modified Example)

A method of manufacturing a semiconductor integrated circuit according to a first modified example of the embodiment of the present invention is illustrated below with a case of further selectively implanting impurity ions under the field oxide film 30 in the ion implantation step for forming the first well region 22 and the second well region 23.

Figure 27:
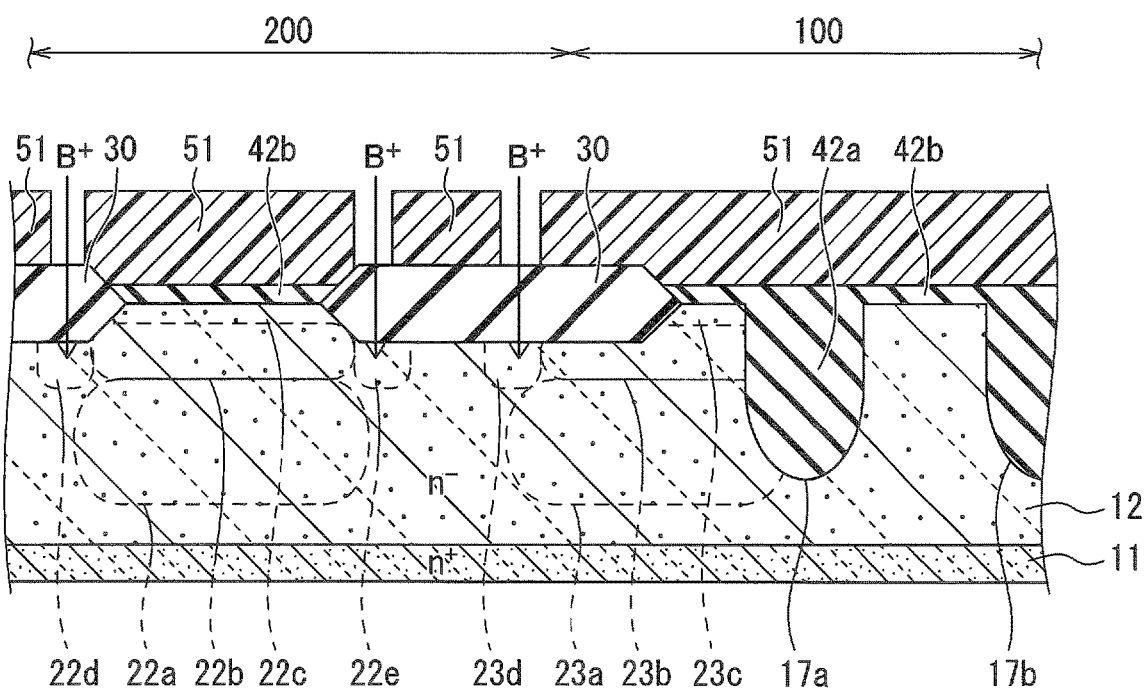
FIG. 27 is a cross-sectional view illustrating a process of manufacturing the semiconductor integrated circuit according to a first modified example of the embodiment of the present invention.
Figure 28:
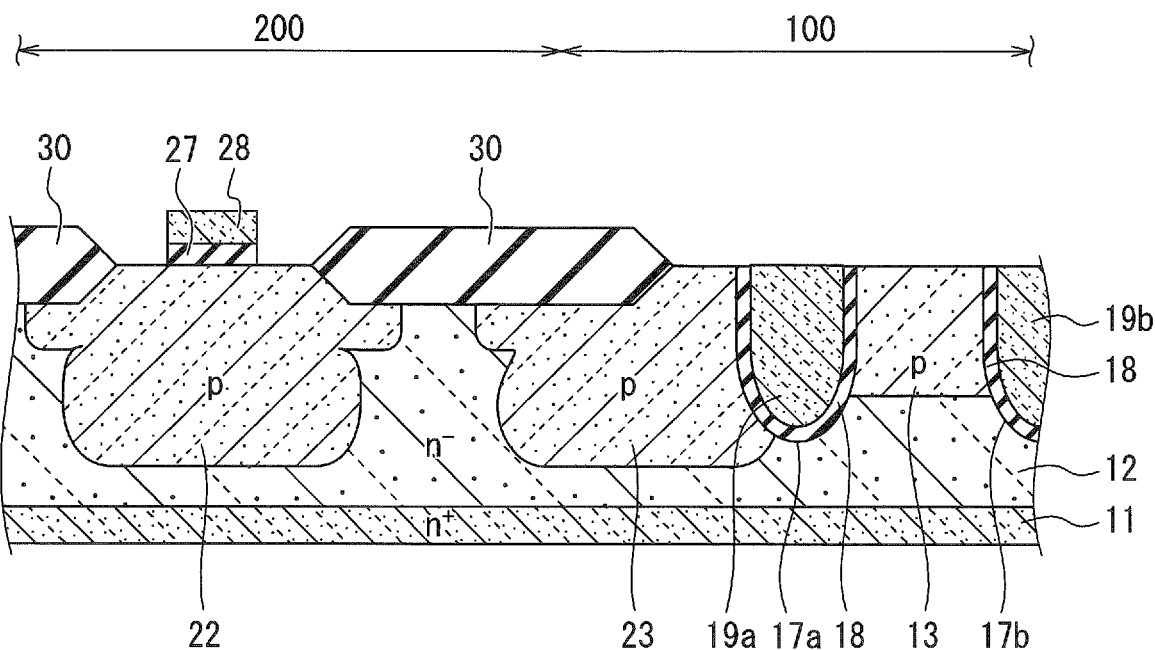
FIG. 28 is a cross-sectional view, continued from FIG. 27, illustrating the process of manufacturing the semiconductor integrated circuit according to the first modified example of the embodiment of the present invention.

First, in the method of manufacturing the semiconductor integrated circuit according to the first modified example of the embodiment of the present invention, the photoresist film 43 is removed after the ion implantation repeated three times, in the same manner as the step illustrated in FIG. 9 in the method of manufacturing the semiconductor integrated circuit according to the embodiment of the present invention. A photoresist film 51 is then coated on the semiconductor layer 12, and is delineated by photolithography. Using the delineated photoresist film 51 as a mask for selective ion implantation, p-type impurity ions are selectively implanted in the top surface of the semiconductor layer 12 to penetrate the field oxide film 30, so as to form first ion implantation regions 22d and 22e on both sides of the first ion implantation region 22b under the field oxide film 30, as illustrated in FIG. 27. A first ion implantation region 23d is also formed adjacent to the first ion implantation region 23b under the field oxide film 30. Further, in the same manner as the steps illustrated in FIG. 10 and FIG. 11 in the method of manufacturing the semiconductor integrated circuit according to the embodiment of the present invention, the multiple ion implantation for forming the body region 13 is performed. The annealing for a short period of time is then carried out, so as to form the first well region 22, the second well region 23, and the body region 13 as illustrated in FIG. 28.

The method of manufacturing the semiconductor integrated circuit according to the first modified example of the embodiment of the present invention increases the impurity concentration under the field oxide film 30 so as to form an inversion layer due to the potential of the wiring formed on the field oxide film 30 if the impurity concentration under the field oxide film 30 is low, avoiding leaking current accordingly.

(Second Modified Example)

The method of manufacturing the semiconductor integrated circuit according to the embodiment has been illustrated with the case of removing the oxidation-resistant films 42a and 42b after the multiple ion implantation step for forming the first well region 22 and the second well region 23 and the multiple ion implantation step for forming the body region 13. A method of manufacturing a semiconductor integrated circuit according to a second modified example of the embodiment of the present invention is illustrated below with a case of removing the oxidation-resistant films 42a and 42b before the multiple ion implantation step for forming the first well region 22 and the second well region 23 and before the multiple ion implantation step for forming the body region 13.

Figure 29:
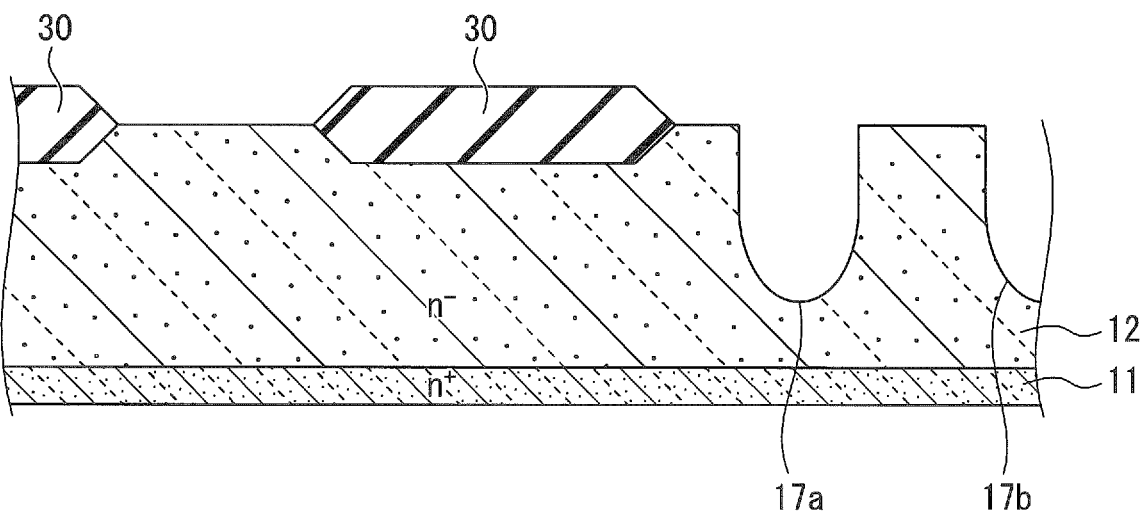
FIG. 29 is a cross-sectional view illustrating a process of manufacturing the semiconductor integrated circuit according to a second modified example of the embodiment of the present invention.
Figure 30:
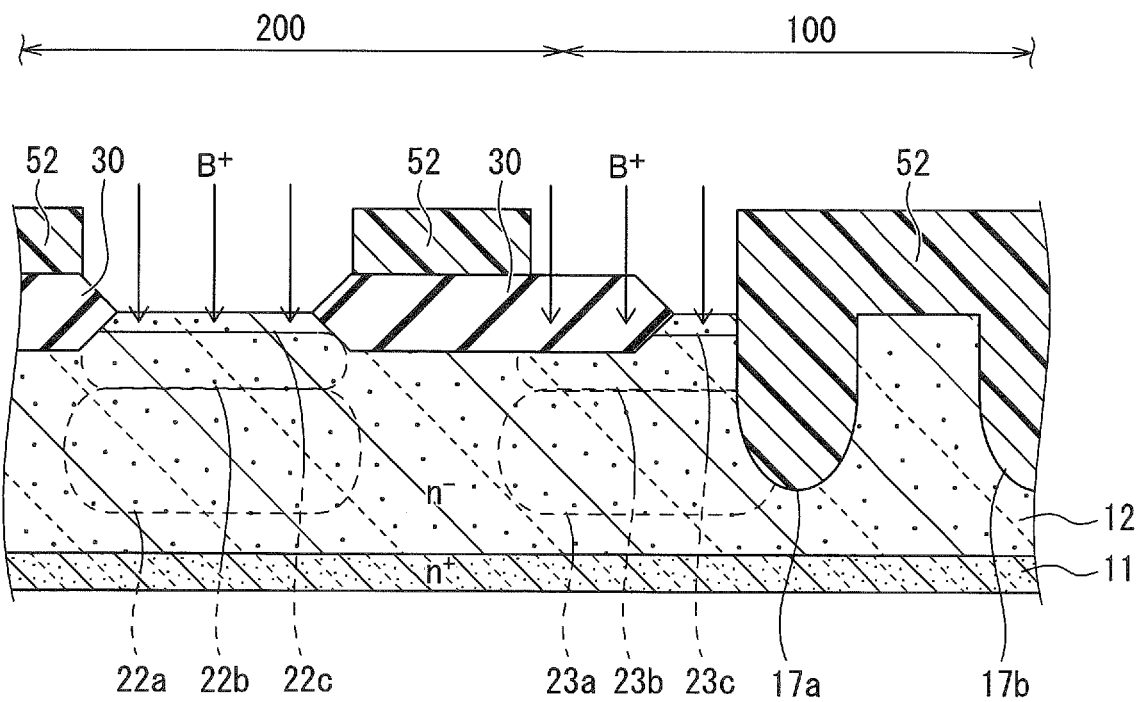
FIG. 30 is a cross-sectional view, continued from FIG. 29, illustrating the process of manufacturing the semiconductor integrated circuit according to the second modified example of the embodiment of the present invention.

First, in the method of manufacturing the semiconductor integrated circuit according to the second modified example of the embodiment of the present invention, the field oxide film 30 is formed in the same manner as the step illustrated in FIG. 6 in the method of manufacturing the semiconductor integrated circuit according to the embodiment of the present invention. As illustrated in FIG. 29, the oxidation-resistant films 42a and 42b are then removed. As illustrated in FIG. 30, a photoresist film 52 is coated on the semiconductor layer 12, and is delineated by photolithography. Using the delineated photoresist film 52 as a mask for selective ion implantation, p-type impurity ions are selectively implanted in the top surface of the semiconductor layer 12. The photoresist film 52 used as a mask for selective ion implantation is then removed.

Figure 31:
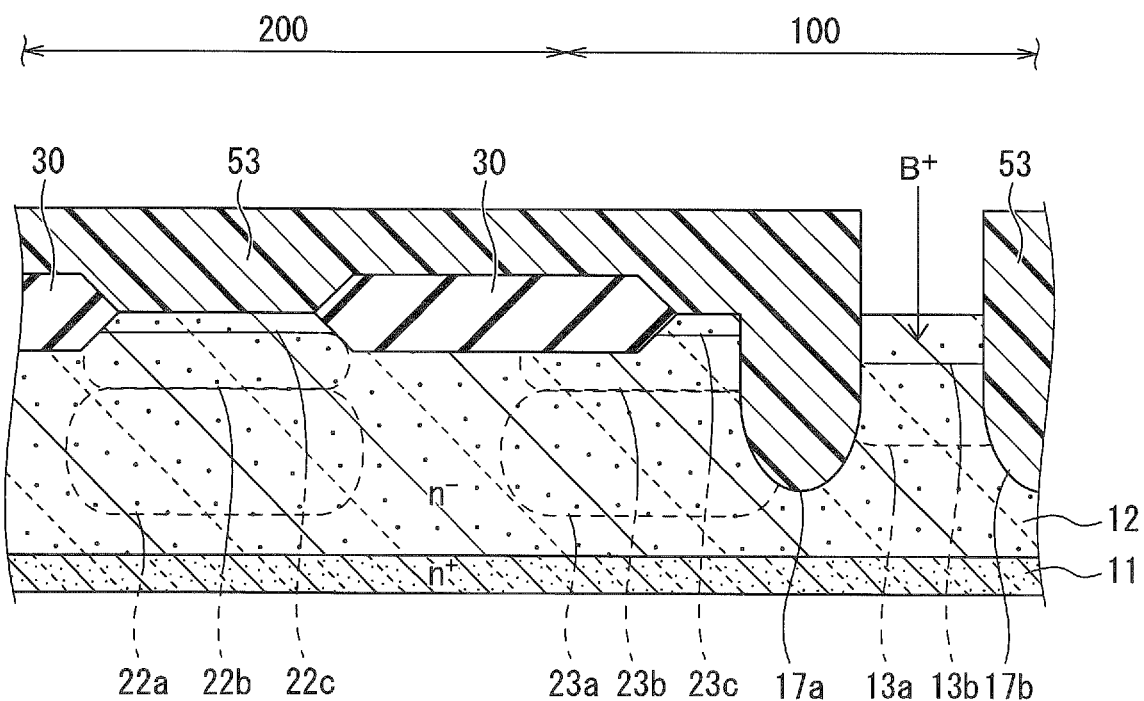
FIG. 31 is a cross-sectional view, continued from FIG. 30, illustrating the process of manufacturing the semiconductor integrated circuit according to the second modified example of the embodiment of the present invention.

Next, a photoresist film 53 is coated on the semiconductor layer 12, and is delineated by photolithography as illustrated in FIG. 31. Using the delineated photoresist film 53 as a mask for selective ion implantation, p-type impurity ions are selectively implanted in the top surface of the semiconductor layer 12. The photoresist film 53 used as a mask for selective ion implantation is then removed. The impurity ions are activated and thermally diffused by annealing for a short period of time. The following steps are the same as those illustrated from FIG. 12 in the method of manufacturing the semiconductor integrated circuit according to the embodiment of the present invention, and overlapping explanations are not repeated below.

(Third Modified Example)

The method of manufacturing the semiconductor integrated circuit according to the embodiment of the present invention has been illustrated with the case of carrying out the multiple ion implantation step for forming the first well region 22 and the second well region 23 independently of the multiple ion implantation step for forming the body region 13. A method of manufacturing a semiconductor integrated circuit according to a third modified example of the embodiment of the present invention is illustrated below with a case in which the multiple ion implantation step for forming the first well region 22 and the second well region 23 and the multiple ion implantation step for forming the body region 13 include at least a single common step of ion implantation.

The method of manufacturing the semiconductor integrated circuit according to the third modified example of the embodiment of the present invention performs ion implantation at a high acceleration voltage (about 1 to 4 MeV, for example) to penetrate the oxidation-resistant films 42a and 42b and the field oxide film 30, so as to form the first ion implantation regions 22a and 23a in the lower stage, in the same manner as the step illustrated in FIG. 7 in the method of manufacturing the semiconductor integrated circuit according to the embodiment of the present invention. The photoresist film 43 is then removed.

Figure 32:
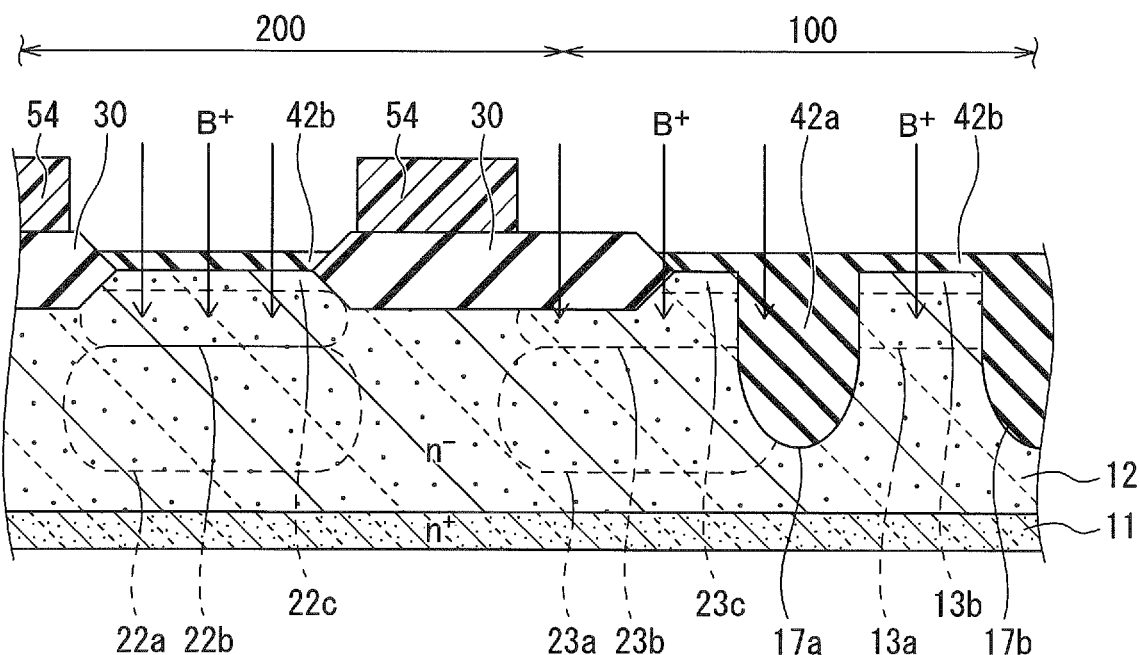
FIG. 32 is a cross-sectional view illustrating a process of manufacturing the semiconductor integrated circuit according to a third modified example of the embodiment of the present invention.

Next, as illustrated in FIG. 32, after an additional photoresist film 54 is delineated, ion implantation is performed at an intermediate acceleration voltage (about 0.3 to 1 MeV, for example) so as not to penetrate the field oxide film 30 or the oxidation-resistant film 42a but to penetrate the oxidation-resistant film 42b to simultaneously form the first ion implantation regions 22b and 23b and the second ion implantation region 13a in the intermediate stage. Subsequently, ion implantation is performed at a low acceleration voltage (about 300 keV of lower, for example) so as not to penetrate the field oxide film 30 but to penetrate the oxidation-resistant film 42b to simultaneously form the first ion implantation regions 22c and 23c and the second ion implantation region 13b in the upper stage. The photoresist film 54 is then removed, and the impurity ions are activated and thermally diffused by annealing for a short period of time. The following steps are the same as those illustrated from FIG. 12 in the method of manufacturing the semiconductor integrated circuit according to the embodiment of the present invention, and overlapping explanations are not repeated below.

(Fourth Modified Example)

The method of manufacturing the semiconductor integrated circuit according to the embodiment of the present invention has been illustrated with the case of forming the field oxide film 30 after forming the trenches 17a and 17b. A method of manufacturing a semiconductor integrated circuit according to a fourth modified example of the embodiment of the present invention is illustrated below with a case of forming the trenches 17a and 17b after forming the field oxide film 30.

Figure 33:
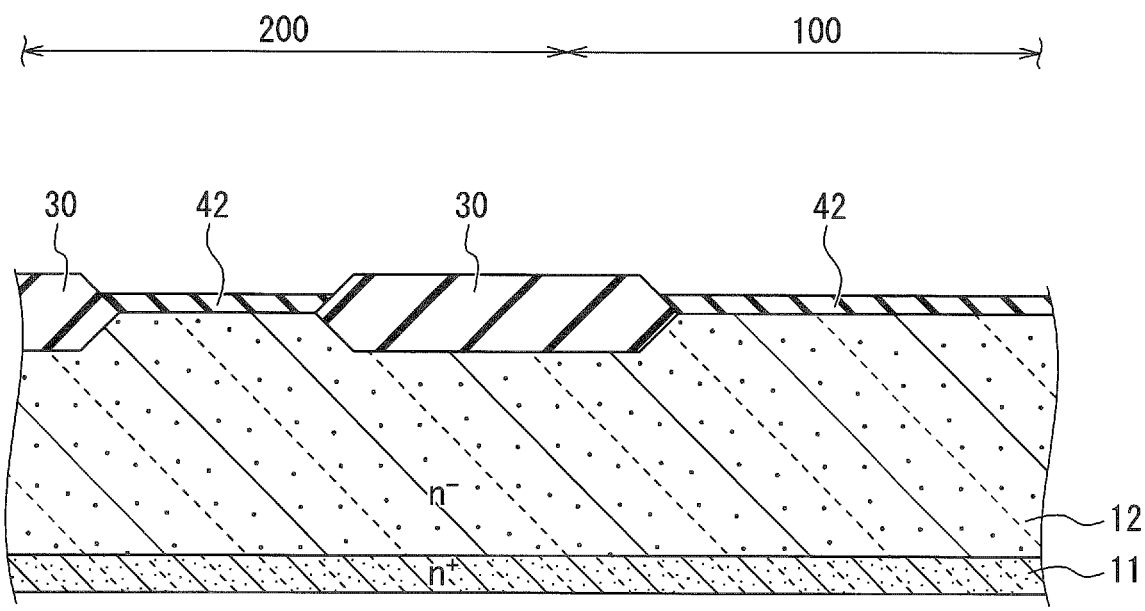
FIG. 33 is a cross-sectional view illustrating a process of manufacturing the semiconductor integrated circuit according to a fourth modified example of the embodiment of the present invention.
Figure 34:
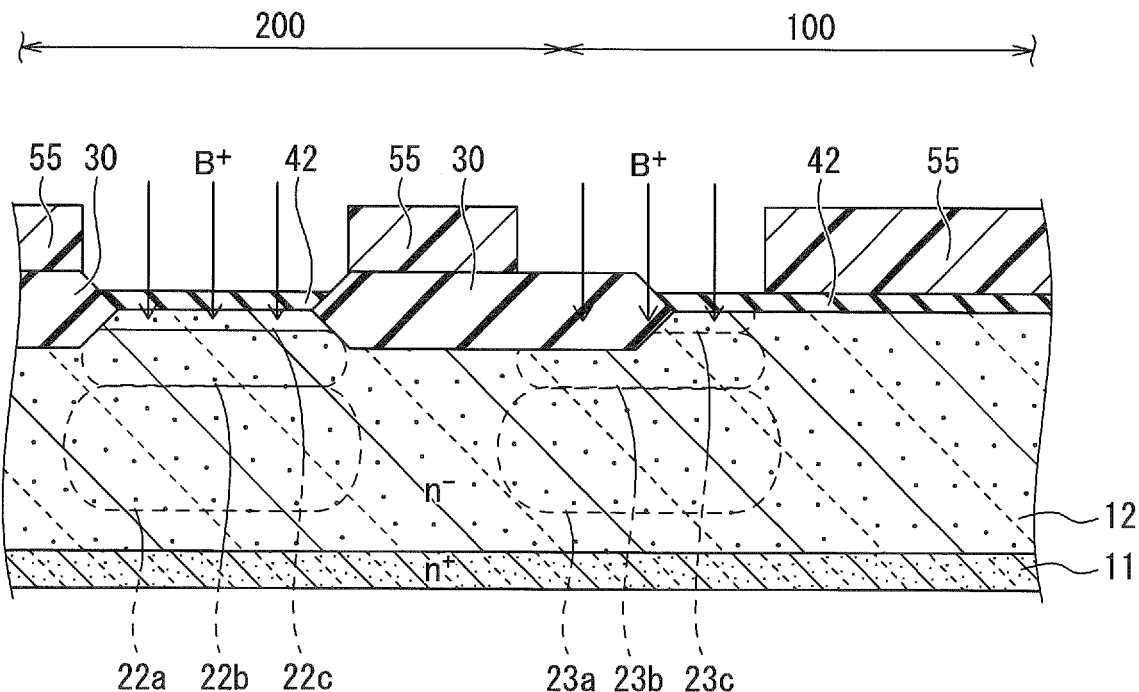
FIG. 34 is a cross-sectional view, continued from FIG. 33, illustrating the process of manufacturing the semiconductor integrated circuit according to the fourth modified example of the embodiment of the present invention.

The method of manufacturing the semiconductor integrated circuit according to the fourth modified example of the embodiment of the present invention forms the semiconductor base body (11, 12) having a two-layer structure, in the same manner as the step illustrated in FIG. 3 in the method of manufacturing the semiconductor integrated circuit according to the embodiment of the present invention. Next, as illustrated in FIG. 33, an oxidation-resistant mask made of the oxidation-resistant film 42 is formed to form the field oxide film 30 in the openings of the oxidation-resistant film 42. Next, as illustrated in FIG. 34, after a photoresist film 55 is delineated, multiple ion implantation at different acceleration voltages is performed, so as to form the first ion implantation regions 22a and 23a in the lower stage, the first ion implantation regions 22b and 23b in the intermediate stage, and the first ion implantation regions 22c and 23c in the upper stage.

Figure 35:
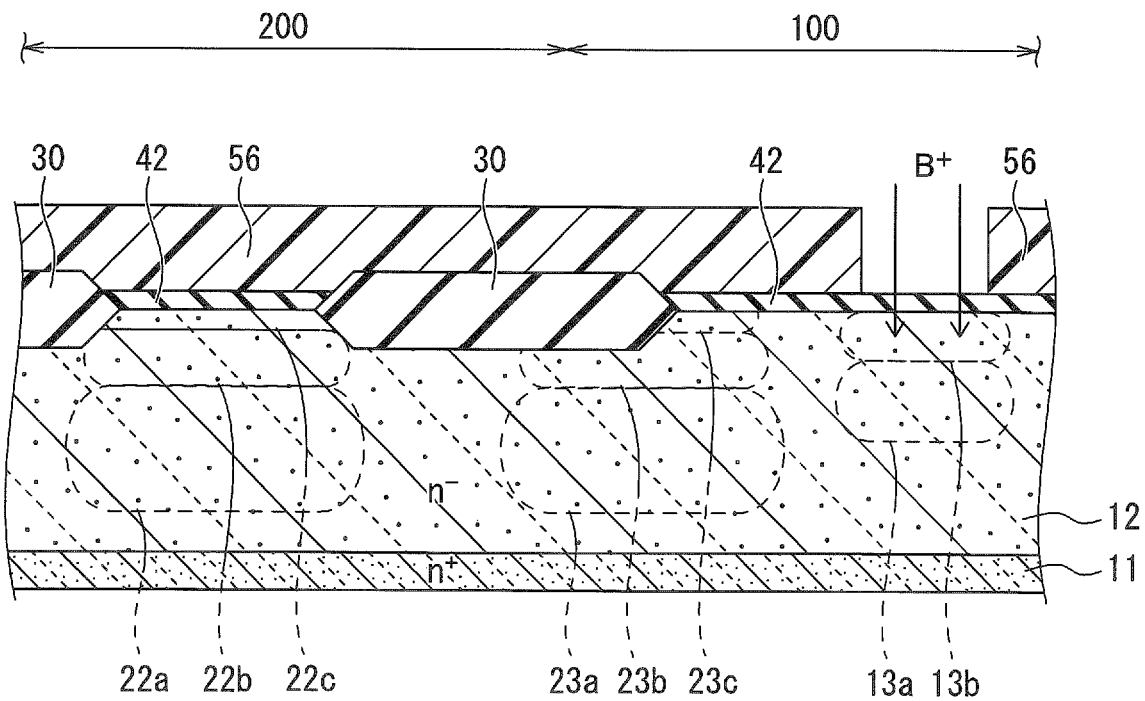
FIG. 35 is a cross-sectional view, continued from FIG. 34, illustrating the process of manufacturing the semiconductor integrated circuit according to the fourth modified example of the embodiment of the present invention.
Figure 36:
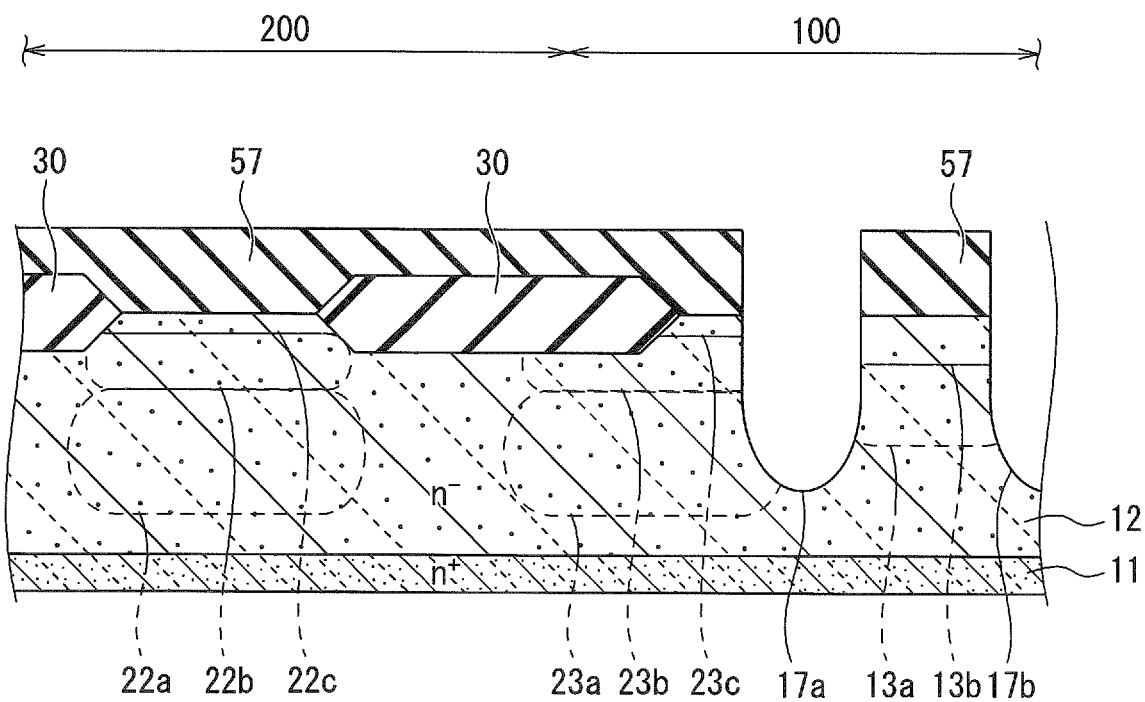
FIG. 36 is a cross-sectional view, continued from FIG. 35, illustrating the process of manufacturing the semiconductor integrated circuit according to the fourth modified example of the embodiment of the present invention.

Next, as illustrated in FIG. 35, after a photoresist film 56 is delineated, multiple ion implantation at different acceleration voltages is performed, so as to form the second ion implantation region 13a in the lower stage and the second ion implantation region 13b in the upper stage. Subsequently, as illustrated in FIG. 36, an etching passivation film 57 such as an oxide film is delineated. Using the delineated etching passivation film 57 as a mask for etching, the trenches 17a and 17b are formed by dry etching such as RIE. The following steps are the same as those illustrated from FIG. 12 in the method of manufacturing the semiconductor integrated circuit according to the embodiment of the present invention, and overlapping explanations are not repeated below.

(Fifth Modified Example)

The method of manufacturing the semiconductor integrated circuit according to the embodiment of the present invention has been illustrated with the case of forming the field oxide film 30 by LOCOS. A method of manufacturing a semiconductor integrated circuit according to a fifth modified example of the embodiment of the present invention is illustrated below with a case of isolating the output-stage element 101 and the control element 201 using element isolation trenches by shallow trench isolation (STI).

Figure 37:
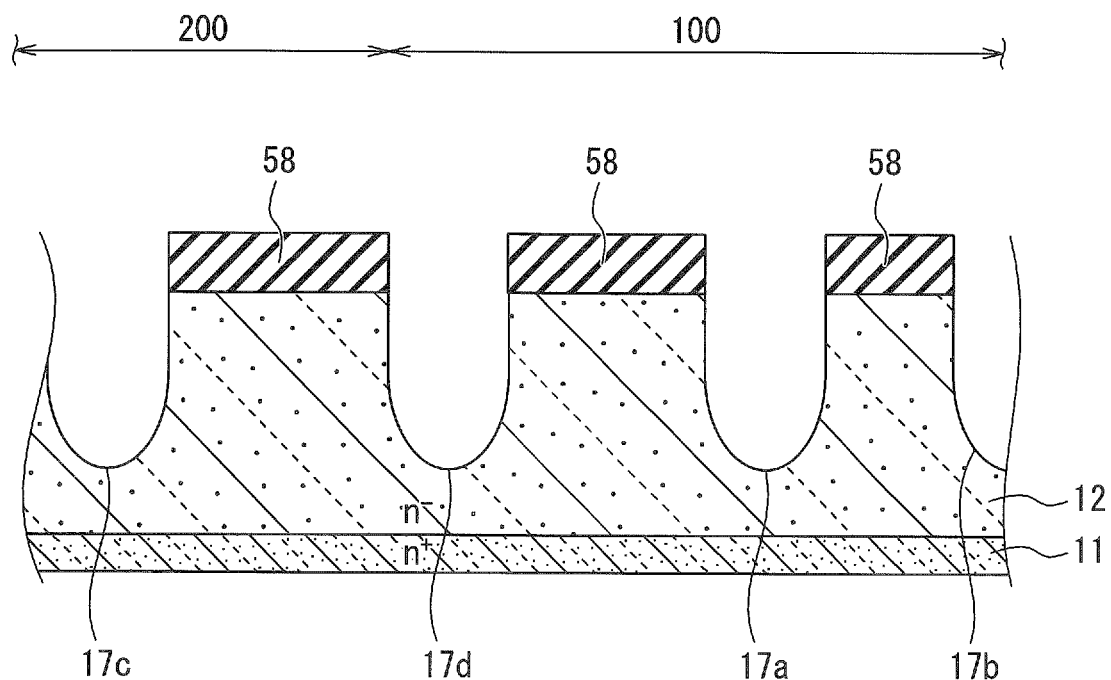
FIG. 37 is a cross-sectional view illustrating a process of manufacturing the semiconductor integrated circuit according to a fifth modified example of the embodiment of the present invention.

The method of manufacturing the semiconductor integrated circuit according to the fifth modified example of the embodiment of the present invention forms the semiconductor base body (11, 12) having a two-layer structure, in the same manner as the step illustrated in FIG. 3 in the method of manufacturing the semiconductor integrated circuit according to the embodiment of the present invention. Next, an etching passivation film 58 such as an oxide film is deposited on the semiconductor layer 12 by a deposition method such as CVD, and is delineated by photolithography and dry etching such as RIE. Using the delineated etching passivation film 58 as an etching mask, the trenches 17a and 17b and element isolation trenches 17c and 17d are selectively dug in the upper portion of the semiconductor base body (11, 12) by dry etching such as RIE, as illustrated in FIG. 37. The etching passivation film 58 used as an etching mask is then removed.

Figure 38:
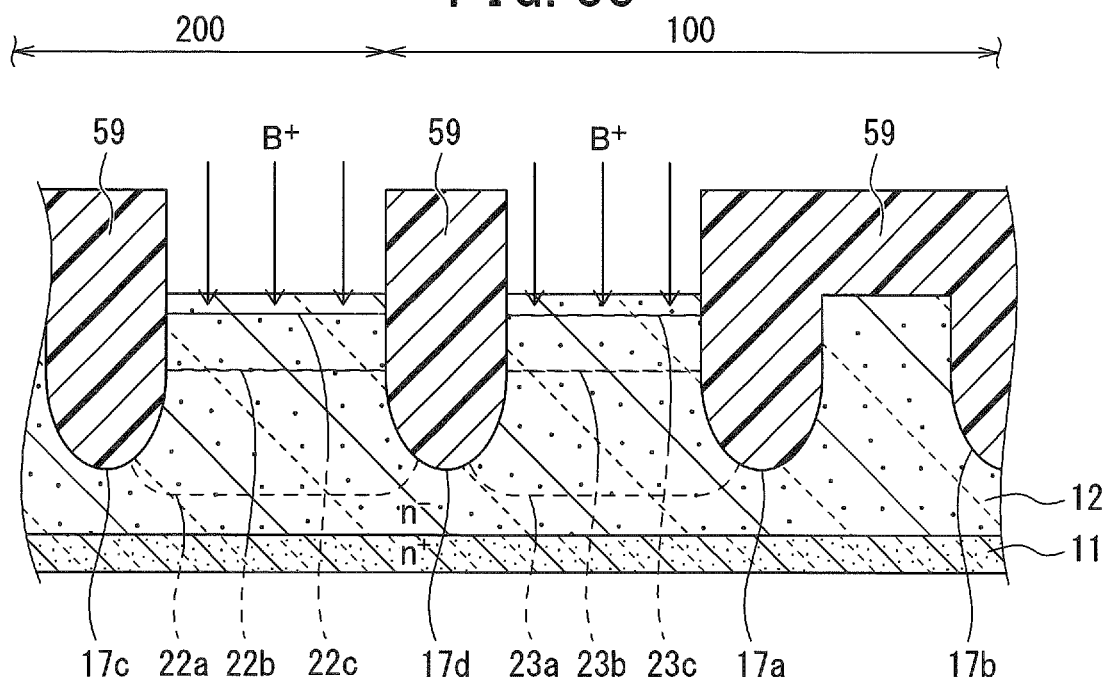
FIG. 38 is a cross-sectional view, continued from FIG. 37, illustrating the process of manufacturing the semiconductor integrated circuit according to the fifth modified example of the embodiment of the present invention.

Next, a photoresist film 59 is coated on the semiconductor layer 12, and is delineated by photolithography. Using the delineated photoresist film 59 as a mask for selective ion implantation, p-type impurity ions are selectively implanted in the top surface of the semiconductor layer 12 by multiple ion implantation, as illustrated in FIG. 38. The photoresist film 59 used as a mask for selective ion implantation is then removed.

Figure 39:
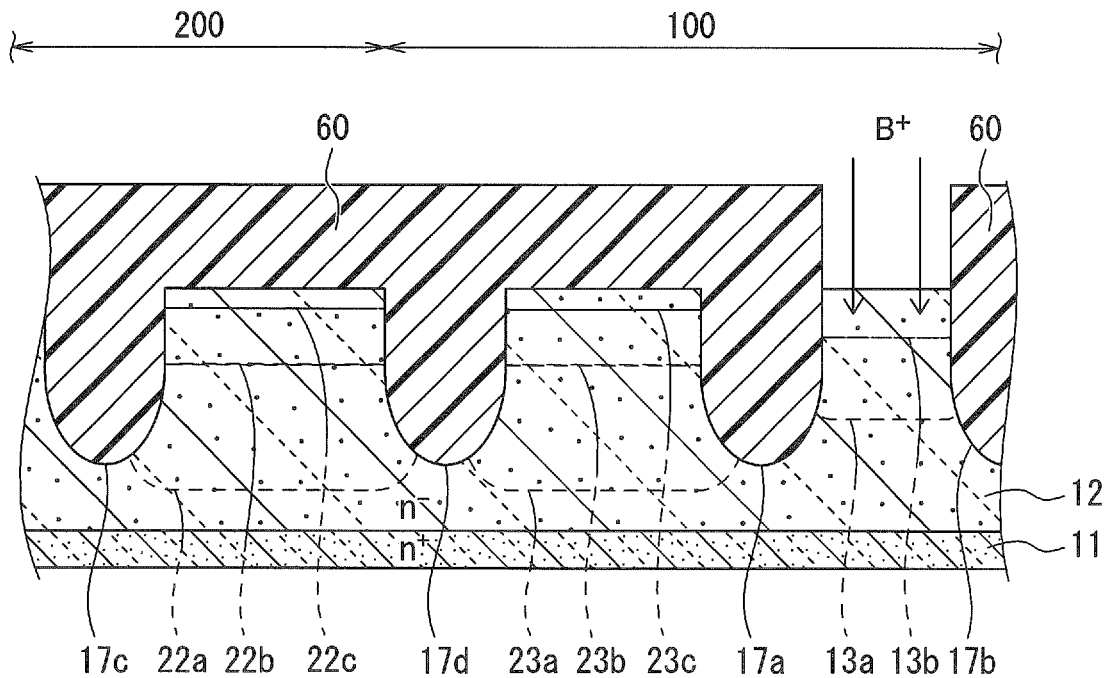
FIG. 39 is a cross-sectional view, continued from FIG. 38, illustrating the process of manufacturing the semiconductor integrated circuit according to the fifth modified example of the embodiment of the present invention.
Figure 40:
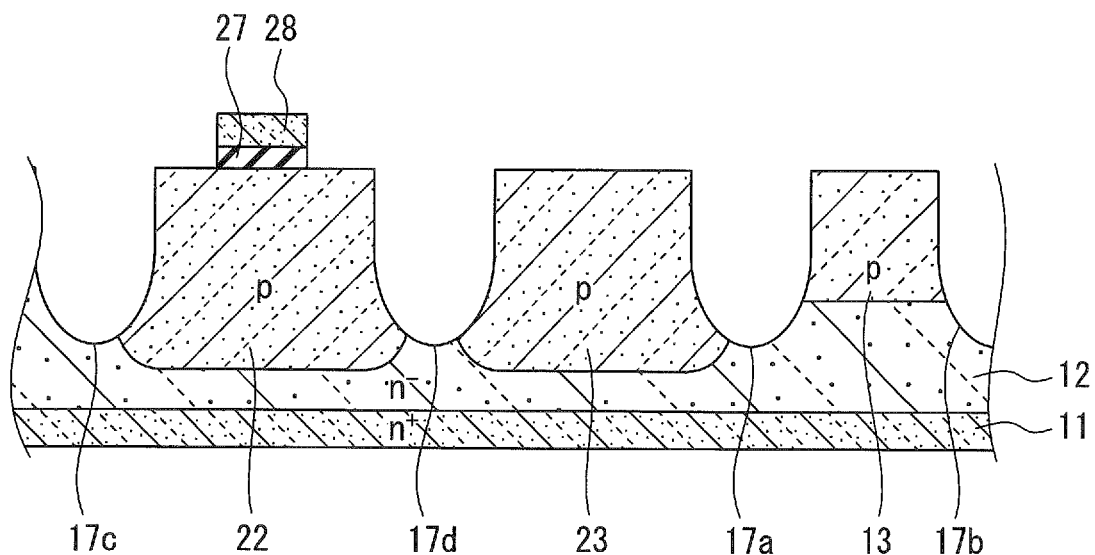
FIG. 40 is a cross-sectional view, continued from FIG. 39, illustrating the process of manufacturing the semiconductor integrated circuit according to the fifth modified example of the embodiment of the present invention.

Next, a photoresist film 60 is coated on the semiconductor layer 12, and is delineated by photolithography. Using the delineated photoresist film 60 as a mask for selective ion implantation, p-type impurity ions are selectively implanted in the top surface of the semiconductor layer 12 by multiple ion implantation, as illustrated in FIG. 39. The photoresist film 60 used as a mask for selective ion implantation is then removed. The first well region 22, the second well region 23, and the body region 13 are then formed by annealing for a short period of time, as illustrated in FIG. 40.

Figure 41:
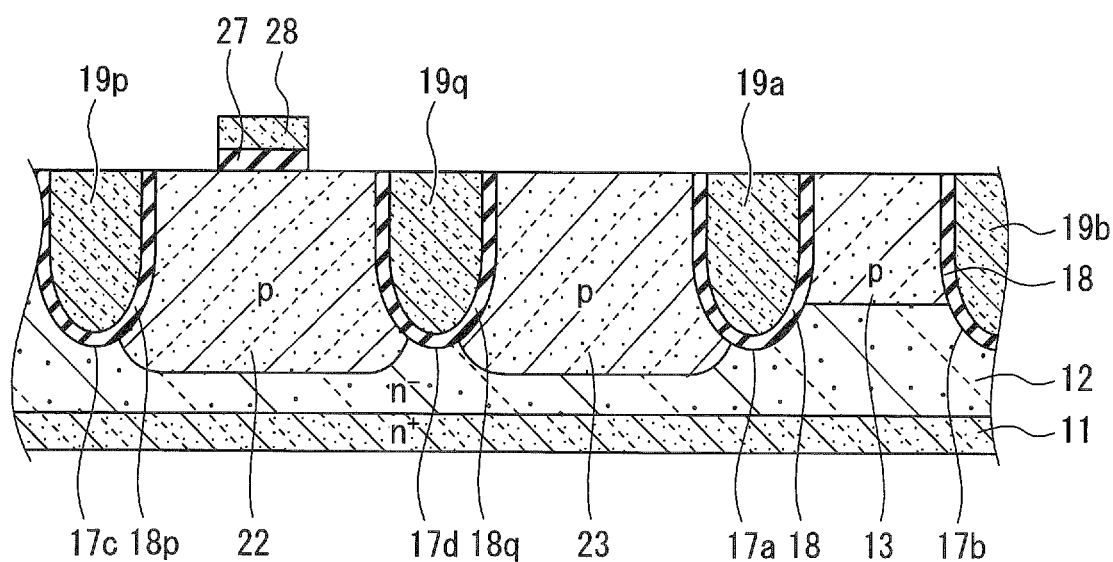
FIG. 41 is a cross-sectional view, continued from FIG. 40, illustrating the process of manufacturing the semiconductor integrated circuit according to the fifth modified example of the embodiment of the present invention.

Next, an insulating film is formed on the semiconductor layer 12 and on the inner walls of the trenches 17a and 17b and the element isolation trenches 17c and 17d by a method such as thermal oxidation. Subsequently, a DOPOS layer is deposited on the insulating film and in the trenches 17a and 17b and the element isolation trenches 17c and 17d by a deposition method such as CVD. A photoresist film is coated on the DOPOS layer, and is delineated by photolithography. Using the delineated photoresist film as an etching mask, the DOPOS layer and the insulating film are delineated by dry etching such as RIE. The photoresist film used as an etching mask is then removed. The gate insulating film 18 and 27 and element isolation insulating films 18p and 18q each made of the insulating film, and the gate electrode 28 and the gate electrode 19a and 19b and dummy electrodes 19p and 19q each made of the DOPOS layer are thus formed, as illustrated in FIG. 41. The dummy electrodes 19p and 19q may be in a floating state, or may be connected to the lowest potential (such as a ground potential) to be connected with the control element 201. The following steps are substantially the same as those in the method of manufacturing the semiconductor integrated circuit according to the embodiment of the present invention, and overlapping explanations are not repeated below.

(Other Embodiments)

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

The above embodiment of the present invention has been illustrated with the case of the trench gate MOSFET used as the output-stage element 101 in the output unit 100, but is not limited to this case. For example, the output-stage element may be a trench gate IGBT. When the output-stage element is an IGBT, the rear surface contact layer 11 illustrated in FIG. 1 is used as a semiconductor layer of $p^+$-type. While the above embodiment of the present invention has been illustrated with the case in which the control element 201 in the circuit unit 200 implements a CMOS, the control element 201 is not limited to the CMOS, and may be a control circuit formed of any other semiconductor element.

The above embodiment has been illustrated with the case of using silicon (Si) for the semiconductor base body (11, 12). The embodiment can also be applied to a case of using a semiconductor (wide-bandgap semiconductor) material having a greater band gap than Si, such as silicon carbide (SiC), gallium nitride (GaN), diamond, or aluminum nitride (AlN).

The above embodiment has been illustrated with the semiconductor base body (11, 12) having the structure illustrated in FIG. 1 in which the semiconductor layer 12 of $n^-$-type is epitaxially grown on the rear surface contact layer 11 made of a semiconductor substrate of $n^+$-type, but is not limited to this structure. For example, using a buried layer of $n^+$-type epitaxially grown on a support substrate (semiconductor wafer) of p-type, instead of the rear surface contact layer 11, the semiconductor layer 12 of $n^-$-type may be epitaxially grown on the buried layer of $n^+$-type so as to implement a semiconductor base body having a three-layer structure. When the semiconductor base body having a three-layer structure uses the epitaxially-grown buried layer of $n^+$-type instead of the rear surface contact layer 11, a sinker region is provided to reach the epitaxially-grown buried layer from the top surface of the semiconductor layer 12. Namely, the epitaxially-grown buried layer of $n^+$-type serving as a drain region can be in contact with the top surface side of the semiconductor layer 12 via the sinker region. The drain electrode wiring in this case is provided on the top surface side of the semiconductor layer 12. When using the epitaxially-grown buried layer of $n^+$-type instead of the rear surface contact layer 11, the semiconductor base body may have a SOI structure using the support substrate on the rear surface side as an insulating substrate.

As described above, the invention includes various embodiments of the present invention and the like not described herein. Therefore, the scope of the present inven-

What is claimed is:

1. A method of manufacturing a semiconductor integrated circuit, comprising:
   implanting impurity ions of a second conductivity-type at different implantation positions by multiple implantation in a part of an upper portion of a semiconductor layer of a first conductivity-type so as to selectively form first ion implantation regions;
   implanting the impurity ions of the second conductivity-type at different implantation positions by multiple implantation in another part of the upper portion of the semiconductor layer so as to selectively form second ion implantation regions;
   activating the impurity ions in the first ion implantation regions to form a well region of the second conductivity-type, and activating the impurity ions in the second ion implantation regions to form a body region of the second conductivity-type;
   forming a control element including first and second terminal regions of the first conductivity-type opposed to each other in an upper portion of the well region; and
   forming an output-stage element including an output terminal region of the first conductivity-type in an upper portion of the body region so as to be controlled by the control element.

2. The method of claim 1, wherein implanting impurity ions of the second conductivity-type at different implantation positions by multiple implantation in the part of the upper portion of the semiconductor layer of the first conductivity-type includes:
   using a delineated photoresist film as a mask for performing a first ion implantation that penetrates a first oxidation-resistant film, a second oxidation-resistant film, and an oxide film, to implant impurity ions at a first implantation position, and
   using the delineated photoresist film as a mask for performing a second ion implantation that penetrates the second oxidation-resistant film and the oxide film but does not penetrate the first oxidation-resistant film, to implant impurity ions at a second implantation position, the second implantation position being shallower than the first implantation position with respect to an upper surface of the semiconductor layer of the first conductivity-type.

3. The method of claim 1, wherein implanting impurity ions of the second conductivity-type at different implantation positions by multiple implantation in the part of the upper portion of the semiconductor layer of the first conductivity-type includes:
   using the delineated photoresist film as a mask for performing a third ion implantation that penetrates the second oxidation-resistant film, but does not penetrate the first oxidation-resistant film and the oxide film, to implant impurity ions at a third implantation position, the third implantation position being shallower than the second implantation position with respect to the upper surface of the semiconductor layer of the first conductivity-type.

4. The method of claim 1, wherein implanting impurity ions of the second conductivity-type at different implantation positions by multiple implantation in the part of the upper portion of the semiconductor layer of the first conductivity-type includes:
   performing a first ion implantation at a first acceleration voltage, and
   performing a second ion implantation at a second acceleration voltage, the second acceleration voltage being a lower acceleration voltage than the first acceleration voltage.

5. The method of claim 1, wherein the method includes at least a single common ion implantation step when selectively forming the first ion implantation regions and selectively forming the second ion implantation regions.

6. The method of claim 1, wherein the output-stage element further includes another output terminal region of the first conductivity-type opposed to the output terminal region in the upper portion of the body region.

7. The method of claim 1, wherein the second ion implantation regions are selectively formed such that a deepest implantation position of the impurity ions implanted by the multiple implantation differs from a deepest implantation position of the impurity ions implanted in the first ion implantation regions.

8. The method of claim 7, wherein the method includes at least a single common ion implantation step when selectively forming the first ion implantation regions and selectively forming the second ion implantation regions.

9. The method of claim 1, further comprising digging a trench in still another part of the upper portion of the semiconductor layer before selectively forming the first ion implantation regions and selectively forming the second ion implantation regions.

10. The method of claim 9, further comprising forming an oxidation-resistant film on the semiconductor layer so as to be buried in and fill the trench before selectively forming the first ion implantation regions and selectively forming the second ion implantation regions.

11. The method of claim 10, wherein implanting impurity ions of the second conductivity-type at different implantation positions by multiple implantation in the part of the upper portion of the semiconductor layer of the first conductivity-type further includes:
   performing a third ion implantation at a third acceleration voltage, the third acceleration voltage being a lower acceleration voltage than the second acceleration voltage.

12. The method of claim 10, further comprising:
   delineating the oxidation-resistant film to form an oxidation-resistant mask;
   subjecting an opening of the oxidation-resistant mask to thermal oxidation so as to locally form a field oxide film; and
   removing the oxidation-resistant mask after selectively forming the first ion implantation regions and selectively forming the second ion implantation regions.

13. The method of claim 12, further comprising, after removing the oxidation-resistant mask, filling the trench with a control electrode structure of the output-stage element.

14. The method of claim 12, further comprising:
   after locally forming the field oxide film,
   conducting photolithography for delineating a mask for first selective ion implantation so as to selectively form the first ion implantation regions; and
   conducting photolithography for delineating a mask for second selective ion implantation so as to selectively form the second ion implantation regions.

15. The method of claim 14, further comprising conducting photolithography for delineating a mask for third selective ion implantation, different from the mask for the first selective ion implantation for selectively forming the first ion implantation regions,
  wherein the first ion implantation regions are selectively formed by use of both the mask for the first selective ion implantation and the mask for the third selective ion implantation.

16. The method of claim 14, wherein an acceleration voltage at least in one step of the multiple implantation for forming the respective first and second ion implantation regions is set to a value so as not to allow the impurity ions to penetrate the field oxide film.

17. The method of claim 14, wherein an acceleration voltage in each step of the multiple implantation for forming the second ion implantation regions is set to a value so as not to allow the impurity ions to penetrate the oxidation-resistant film buried in the trench.

18. The method of claim 14, wherein an acceleration voltage in each step of the multiple implantation for forming the respective first and second ion implantation regions is set to a value so as to allow the impurity ions to penetrate the oxidation-resistant mask.

19. The method of claim 14, wherein an acceleration voltage at least in one step of the multiple implantation for forming the respective first and second ion implantation regions is set to a value so as to allow the impurity ions to penetrate the field oxide film.

* * * * *